United States Patent [19]

Rudy, Jr. et al.

[11] Patent Number: 5,128,835
[45] Date of Patent: Jul. 7, 1992

[54] DATA CURRENT COUPLER WITH INTERNAL SHIELDING FOR ELECTRONIC PACKAGE

[75] Inventors: William J. Rudy, Jr., Annville; Howard R. Shaffer, Millersburg, both of Pa.

[73] Assignee: AMP Incorporated, Harrisburg, Pa.

[21] Appl. No.: 576,339

[22] Filed: Aug. 31, 1990

[51] Int. Cl.$^5$ .............................................. H05K 9/00
[52] U.S. Cl. ..................... 361/424; 361/392; 361/399
[58] Field of Search .............................. 307/17, 80–91, 307/148, 147; 361/380, 392, 395, 400, 424, 421; 336/73

[56] References Cited

U.S. PATENT DOCUMENTS

| | | | |
|---|---|---|---|
| Re. 33,153 | 1/1990 | Althouse et al. | 439/608 |
| 3,504,188 | 3/1970 | Ficker | 307/18 |
| 4,264,827 | 4/1981 | Herzog | 307/17 |
| 4,507,709 | 3/1985 | Morris et al. | 361/400 |
| 4,578,739 | 3/1986 | McKee et al. | 361/395 |
| 4,605,269 | 8/1986 | Cohen et al. | 339/17 LC |
| 4,728,914 | 3/1988 | Morris et al. | 361/395 |
| 4,766,520 | 8/1988 | Huber et al. | 361/421 |
| 4,870,863 | 10/1989 | Duncan et al. | 361/395 |
| 4,904,879 | 2/1990 | Rudy, Jr. et al. | 252/285 |
| 4,921,453 | 5/1990 | O'Brien | 439/630 |
| 4,939,623 | 7/1990 | Equi et al. | 361/400 |
| 5,047,260 | 9/1991 | Durand | 427/54.1 |

FOREIGN PATENT DOCUMENTS 0155542 9/1985 European Pat. Off. ............ 361/400

OTHER PUBLICATIONS

AEEC Letter #87-094/SAI-309, Jul. 17, 1987, pp. 1,7,9, Aeronautical Radio Inc., Annapolis, MD.
AEEC, Letter#87-122/SAI-313,Sep. 17, 1987, pp. 1, 38-44; Aeronautical Radio, Inc., Annapolis, MD.
AEEC Letter#88-077/SAI-331, May, 20 1988, pp. 1-12; Aeronautical Radio, Inc., Annapolis, MD.

Primary Examiner—Leo P. Picard
Assistant Examiner—D. Sparks
Attorney, Agent, or Firm—Anton P. Ness

[57] ABSTRACT

An upper member for inducting power in a coupler assembly having an electromagnet core is a subassembly of a top body member and a bottom body member which enclose a circuit substrate. The circuit substrate is disposed within a cavity between the top and bottom body members, and includes electrical components surface mounted on at least one surface of the circuit substrate. EMI/RFI shielding is formed by plating of at least the surfaces around the cavity surrounding the circuit substrate, and conductively joining the top and bottom body members completely surrounding the circuit substrate thereby protecting the electrical components from EMI/RFI interference.

10 Claims, 18 Drawing Sheets

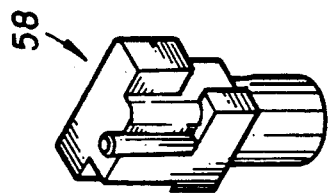
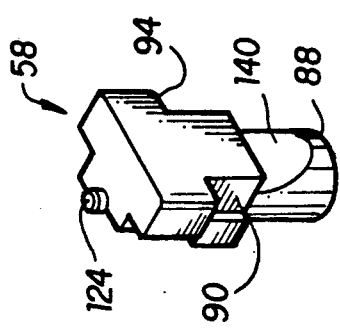
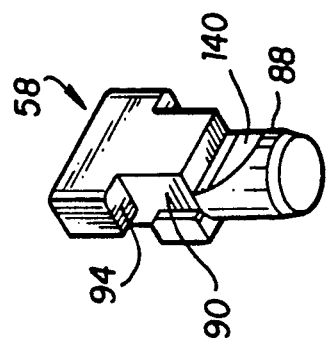
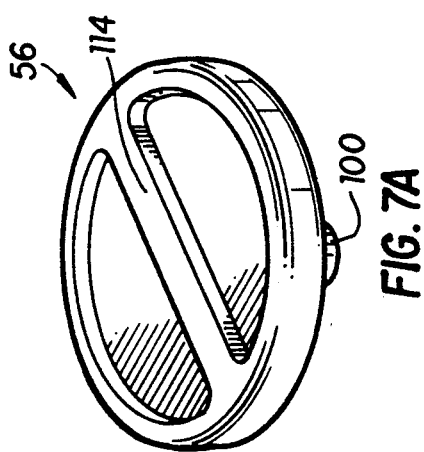
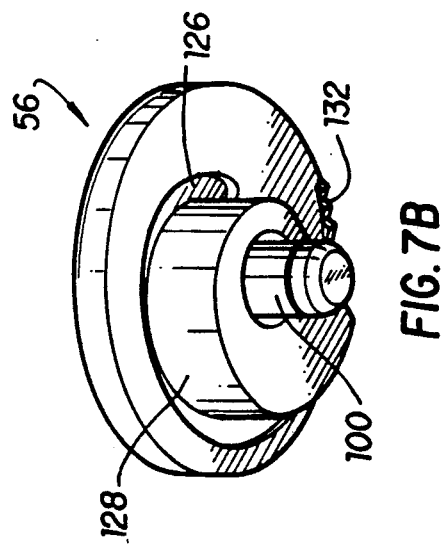

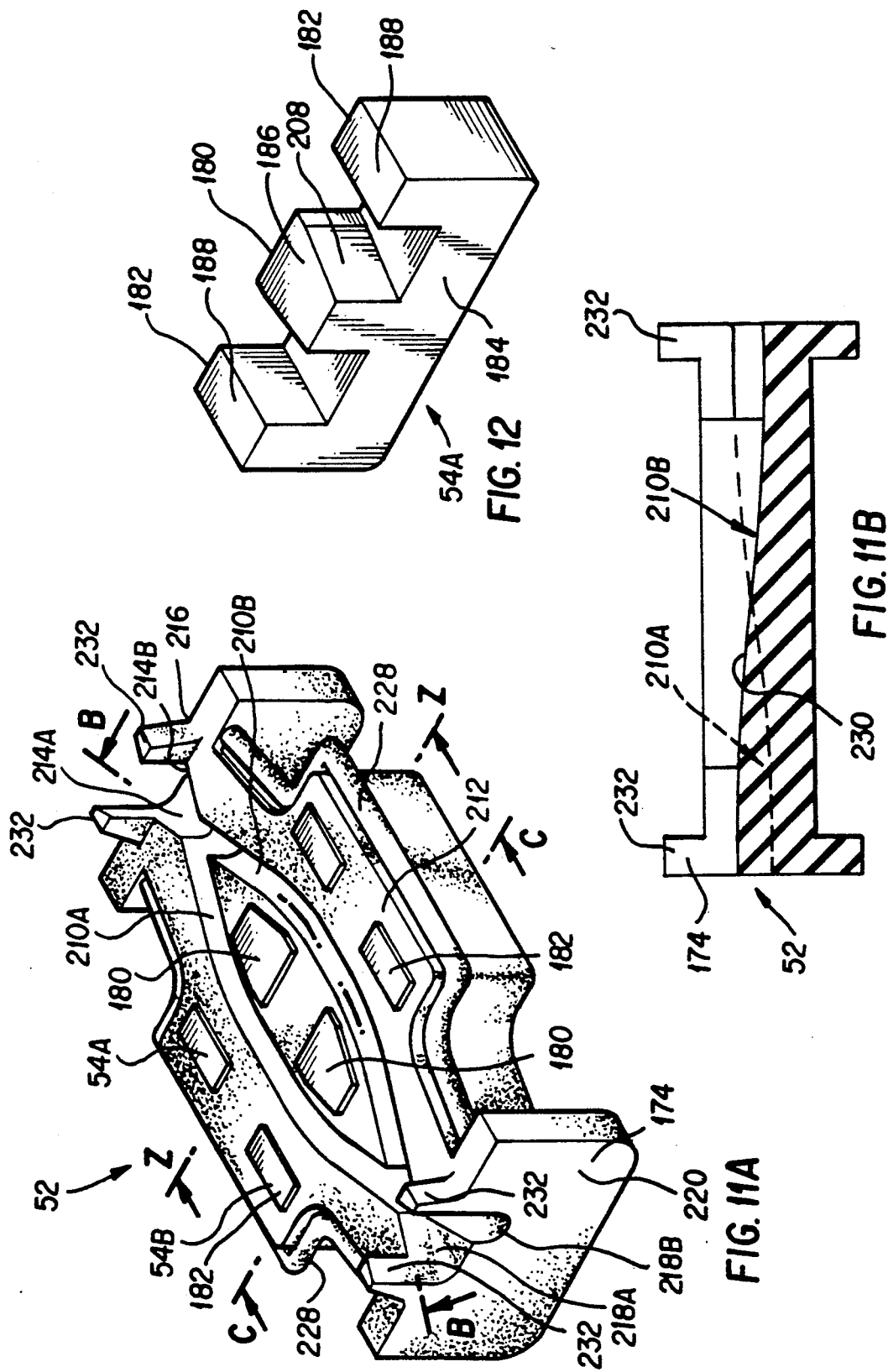

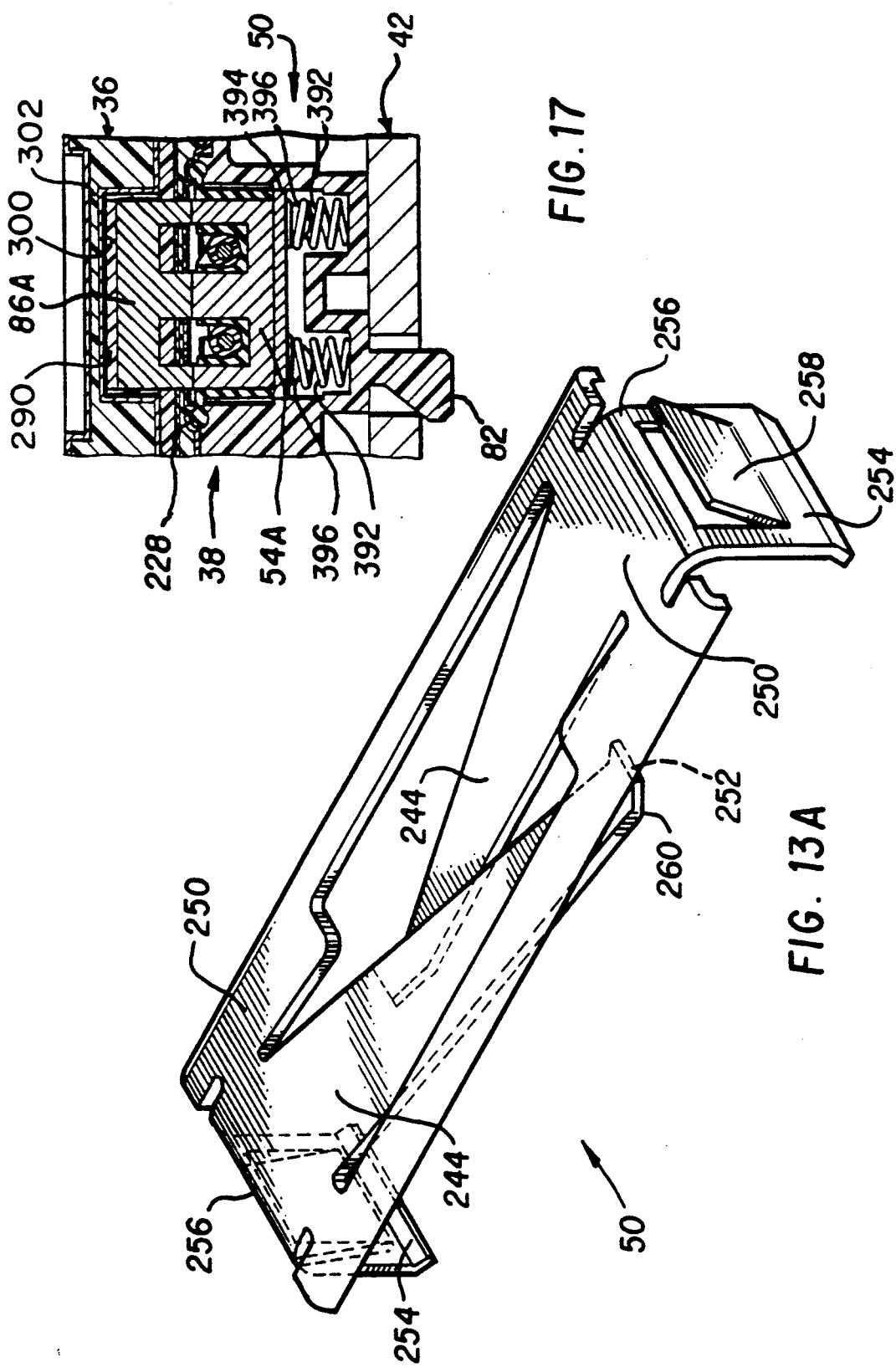

DATA CURRENT COUPLER WITH INTERNAL SHIELDING FOR ELECTRONIC PACKAGE

REFERENCE TO RELATED APPLICATIONS

This application is related to U.S. patent applications Ser. Nos. 07/576,331; 07/576,335; and 07/576,338 all filed Aug. 31, 1990 and Ser. No. -7/576,341 filed Aug. 31, 1990 now Ser. No. 07/723,732, all assigned to the assignee hereof.

FIELD OF THE INVENTION

The present invention relates to the field of electrical connectors and more particularly to noninvasive coupler assemblies and component parts thereof, useful for sensing and transmitting electrical signals from conductor wires of a twisted pair cable of a data bus.

BACKGROUND OF THE INVENTION

U.S. Pat. No. 4,904,879 describes a data current coupler/assembly, and method of making and assembling the coupler, for receiving signals from conductor wires of a twisted pair of a data bus and transmitting signals therealong. The coupler assembly noninvasively couples the data bus to the conductor wires by using mating pairs of E-shaped electromagnets having windings about central legs of the magnets which are electrically connected to a control unit to sense and transmit signals along the data bus. A lower member, having a cavity to receive conductor wires of the data bus positioned adjacent to the lower electromagnets, is mounted to a panel. An upper member with upper electromagnets includes a circuit substrate having trace windings about substrate apertures, an electronic subassembly to which the windings are electrically connected to amplify transmitted and received signals, and a shielded electrical connector secured at a connector end connected to circuits of the electronic subassembly and matable with a connector of a cable extending to the control unit. The upper member is releasable connected to the upper member via a fastening means and securing means.

U.S. Pat. No. 4,264,827 discloses a method of sensing the transmission of low-level signal current through an electrical conductor without an electrical connection to the conductor, using a continuous closed loop conductor wire extending from a current source with coils of the conductor looped around electromagnet coil articles connected to electronic devices, which arrangement senses changes in the electromagnetic field established by the current. The arrangement can be repeated at a plurality of locations spaced along the conductor with minimal effect to the signal transmission, and can allow signaling of a plurality of electronic devices in response to the signal current passing through the conductor.

Such a current sensing system is desired to be placed aboard aircraft for use with black boxes and other electronic control units, as is disclosed in Proposed ARINC Standard 629 presently being considered by the Airlines Electronic Engineering Committee (AEEC) of Aeronautical Radio, Inc. (ARINC) of Annapolis, Md., and AEEC Letters Nos. 87-094/SAI-309, 87-122/SAI-313, and 88-077/SAI-331, which are incorporated herein by reference. Such a system may also be used in other environments where it is desired that a single closed loop data bus be used.

The couplers above provide important advantages in operation and assembly. Nevertheless, none of these couplers uses an improved electromagnet structure to provide improved coupler performance including an improved conductive wire positioning within the wire channels along with electromagnet insert having sealing means to position and seal the conductor wires to the assembly, improved electromagnetic interference (EMI) shielding using metallic plating on the upper member rather than a separate shield member, a rugged electromagnetic biasing spring means to improve formation of an electromagnet core, a quick action panel mounting means, and improved aligning means to secure the upper member to the lower member.

It is desired to devise an improved noninvasive coupler assembly for sensing and transmitting electrical signals from a twisted pair of a data bus, and a method of assembly of such a coupler assembly, which provides these important advantages.

SUMMARY OF THE INVENTION

It is an objective of the present invention to provide an improved electromagnet core for a coupler assembly to minimize the dissipation of the strength of signals passing through the data bus system and not interfere with the integrity of the signals through impedance during long term use.

It is a further objective to provide an improved shielding which protects the components of a data current coupler from EMI/RFI without a separate shield member According to the invention, the coupler assembly includes a lower member to which is secured an upper member forming an assembly for noninvasive coupling to a twisted pair of signal conductor wires of a closed loop data bus to read signals being transmitted therealong by a series of electromagnet cores interlaced with loops of the twisted pair. The electromagnetic cores comprise opposing electromagnets positioned in each member and disposed within one or the other of the upper and lower members. Opposing end faces of the legs of the electromagnetic magnets, which may be E-shaped, engage each other preferably under slight compression by a resilient spring means. Portions of the conductor wires of the twisted pair are placed at a selected location therealong in formed arcuate channels extending around the central leg of the permanent magnets in the lower member, and upon the upper member then being secured to the lower member. The coupler assembly also can either transmit and amplify signals therealong by generating an appropriate electromotive force via an electromagnetic field, and also receive and therefor verify the signal it transmits.

Embedded within the dielectric material covering the upper member is a circuit substrate, including electrical components and at least a plurality of layers of trace windings about the center legs of the electromagnets and electrically connected to the electrical components. In turn, the electrical components are electrically connectable at an electrical connector of the upper member with a cable assembly which extends to a corresponding control unit, with the control unit providing electrical power to the electrical components as well as signal and ground connection. The upper member includes shielding formed by metallic plating on the inner surface of the upper member completely around the electronic subassembly and the connections thereof with the connector interface for EMI/RFI protection, which is then covered by an insulative covering.

Embodiments of the invention will now be described with respect to the accompanying drawings.

BRIEF DESCRIPTION OF THE DRAWINGS

FIGS. 7A and 7B are top and bottom isometric views respectively of a cam of the panel mounting means;

FIGS. 8A is a top isometric view of the cam follower of the panel mounting means, FIG. 8B is a top isometric view of the cam follower of panel mounting means of FIG. 8A rotated about ninety degrees; and FIG. 8C is a bottom isometric view of the cam follower of the panel mounting means of FIG. 8A;

FIG. 11A is an isometric view of an electromagnet insert of the lower member,

FIG. 11B is a cross-sectional view taken along line B—B of FIG. 11A and

FIG. 12 is an isometric view of an E-shaped electromagnet;

FIG. 13A is an isometric view of a resilient spring means of the lower member;

FIG. 17 is an alterative embodiment of a resilient spring means for the lower member.

DETAILED DESCRIPTION OF THE PREFERRED EMBODIMENT

Figure 1:
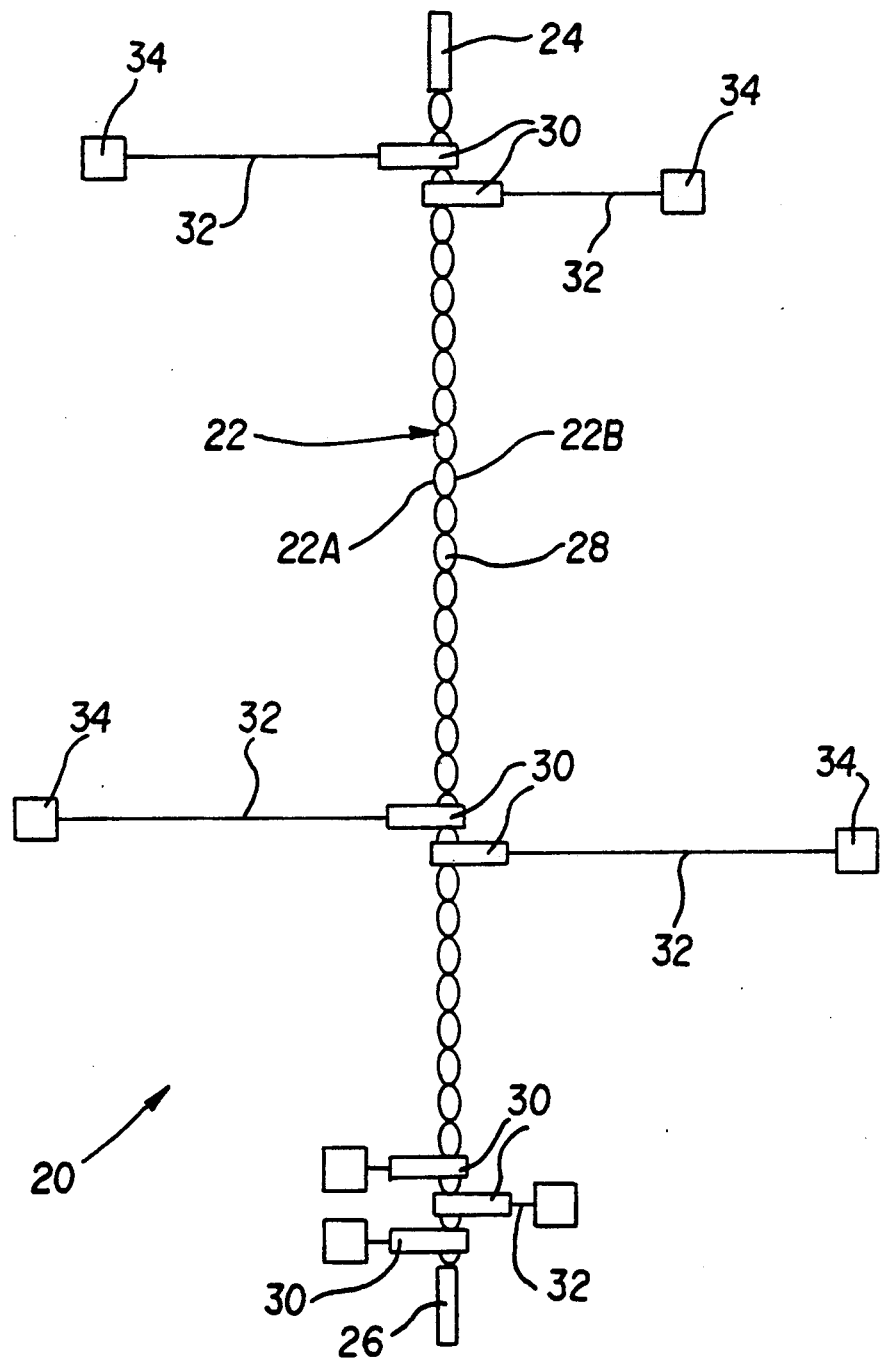
FIG. 1 is a diagrammatic view of a data bus system.

FIG. 1 is a representation of the data bus system 20 to which the present invention is relevant. A twisted pair cable 22 of conductor wires 22A,22B extends between end terminations 24,26 and comprises a closed loop, and a plurality of loops 28 occur at selected spacing, each loop 28 having a length and shape selected to minimize impedance effects and signal reflection. At selected ones of otherwise closed loops 28 are mounted coupler assemblies 30 each having a width preferably less than a loop length to minimize distorting the desired length and shape of an open loop, thereby avoiding impedance effects and signal reflection.

Stub cables 32 extend from the respective coupler assemblies 30 to respective control units 34, such as black boxes, providing electrical connections therebetween. Each control unit 34 preferably has a Serial Interface Module (not shown) for modifying digital signals from Manchester Encoded Signals into doublet signals to be transmitted along the data bus system 20, and correspondingly for translating such encoded signals into digital signals for integrated circuits within the control unit. Each control unit 34 will also provide power for the amplifiers in the coupler assembly 30 to boost received and transmitted signals.

Figure 2:
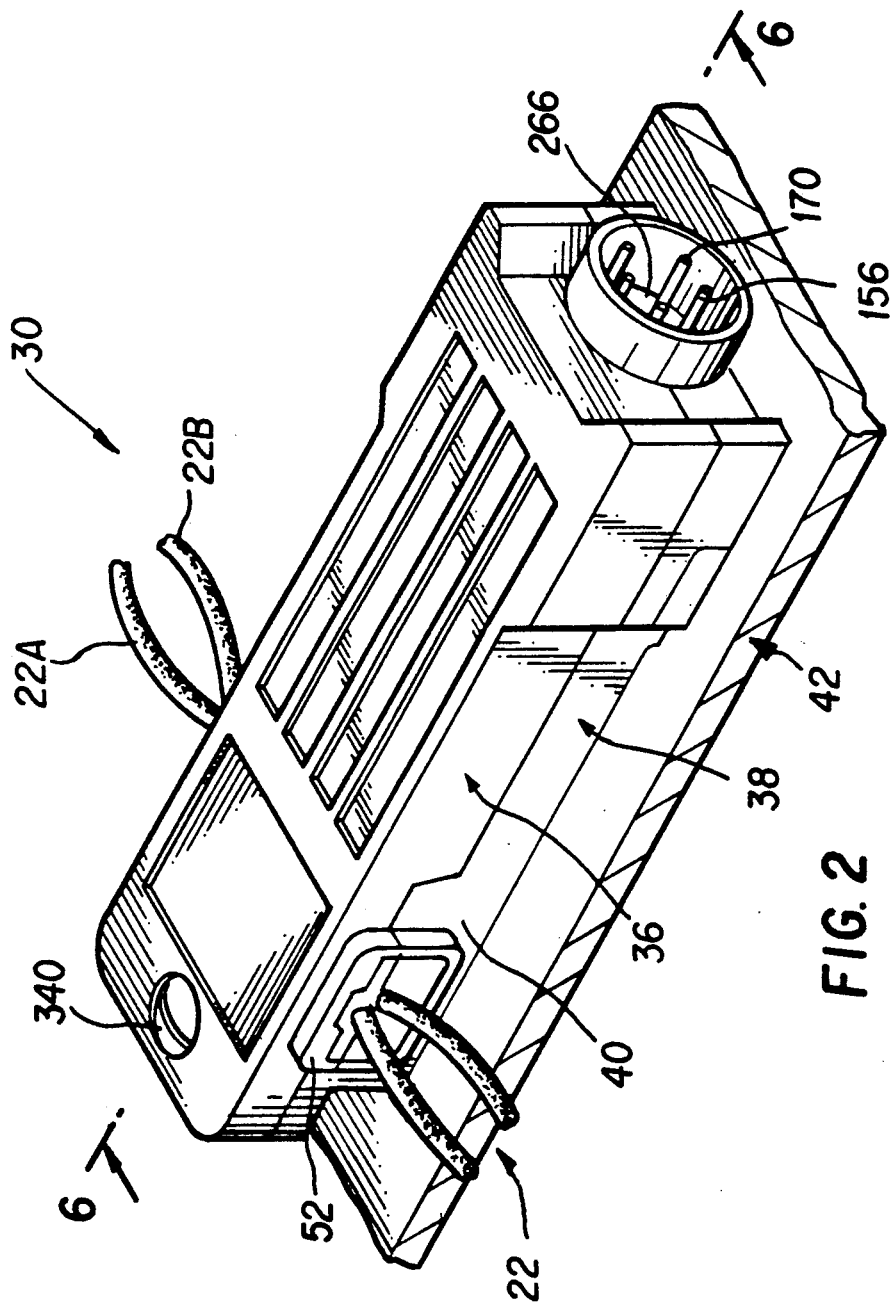
FIG. 2 is an isometric view of the coupler assembly of the present invention coupled to a pair of conductor wires of the data bus of FIG. 1.

FIG. 2 illustrates the coupler assembly 30 of the present invention coupled to the twisted pair cable 22 of conductor wires 22A,22B of a data bus system 20 such as that of FIG. 1 and as disclosed in U.S. Pat. Nos. 4,904,879 and 4,264,827, and the AEEC Letters referred to herein. Coupler assembly 30 is noninvasively affixed at a selected location therealong at a loop 28 of the twisted pair cable 22, slightly opening the loop which would otherwise be closed along cable 22. Coupler assembly 30 comprises an upper member 36 and a lower member 38, with the lower member 38 including a base 40 mounted to a panel 42 by a panel mounting means 44 (not shown).

Figure 3A:
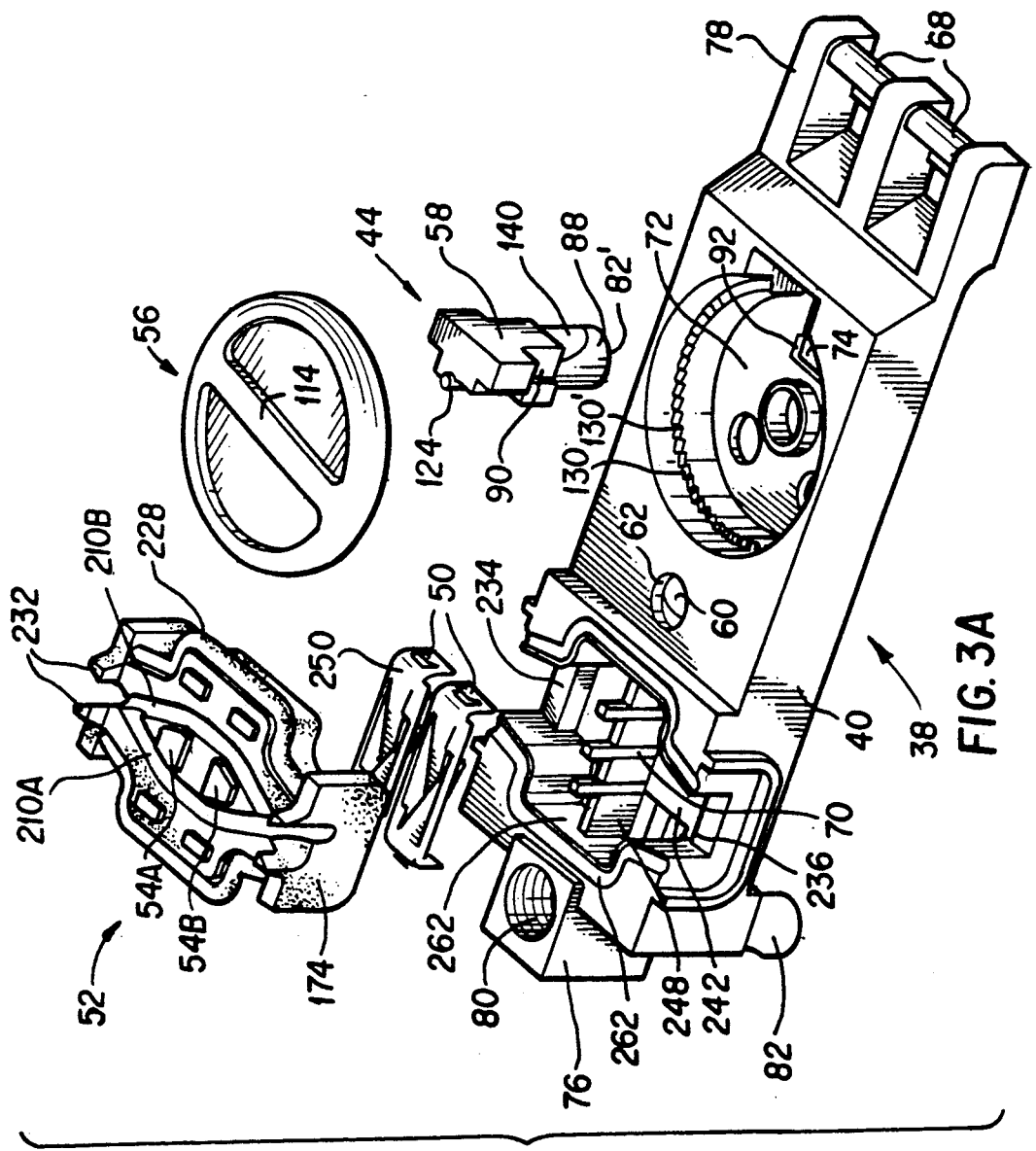
FIG. 3A is an exploded top view in perspective of the lower member of the coupler assembly of FIG. 2.
Figure 3B:
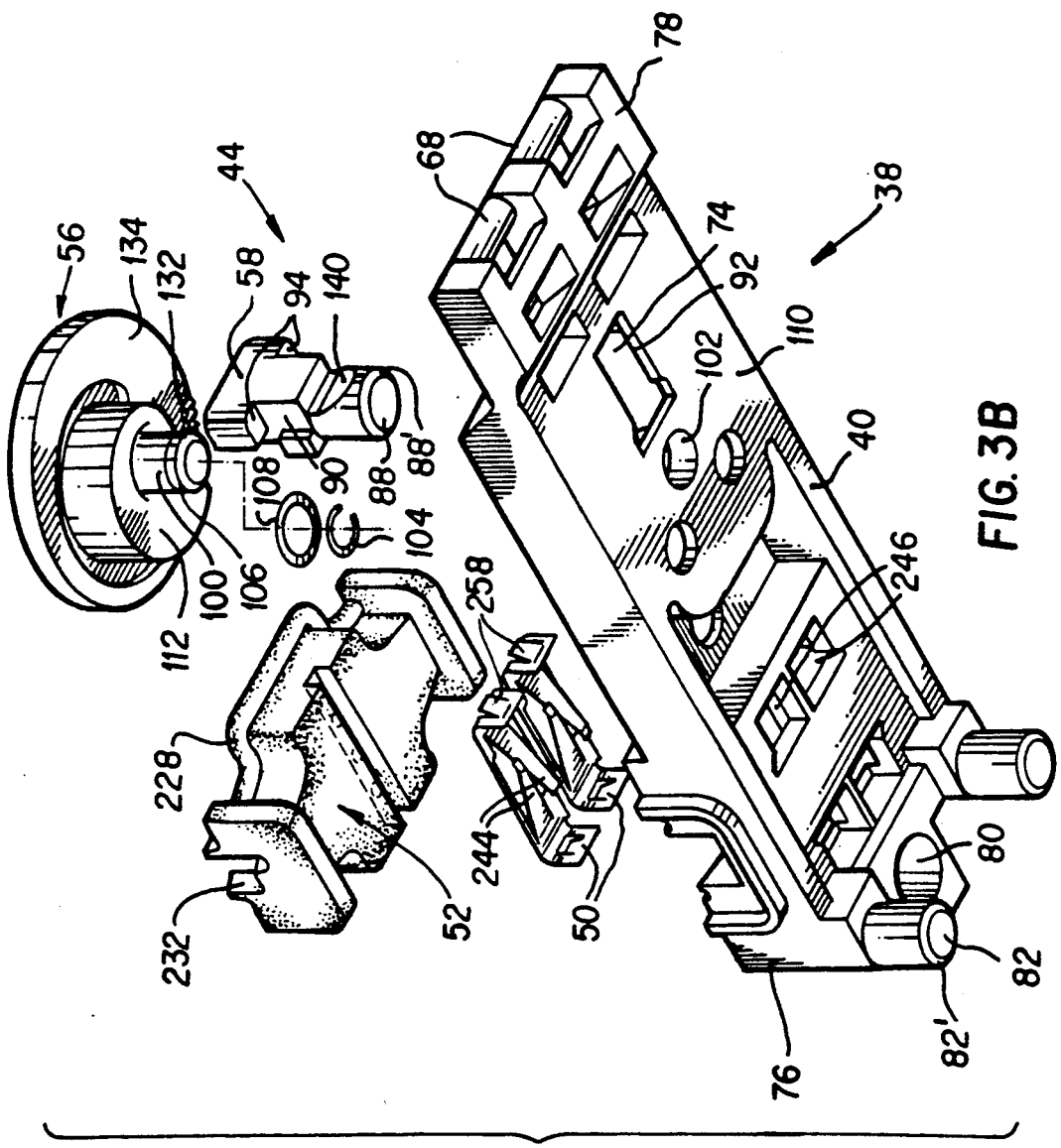
FIG. 3B is an exploded bottom view in isometric of the lower member of coupler of FIG. 2.
Figure 4:
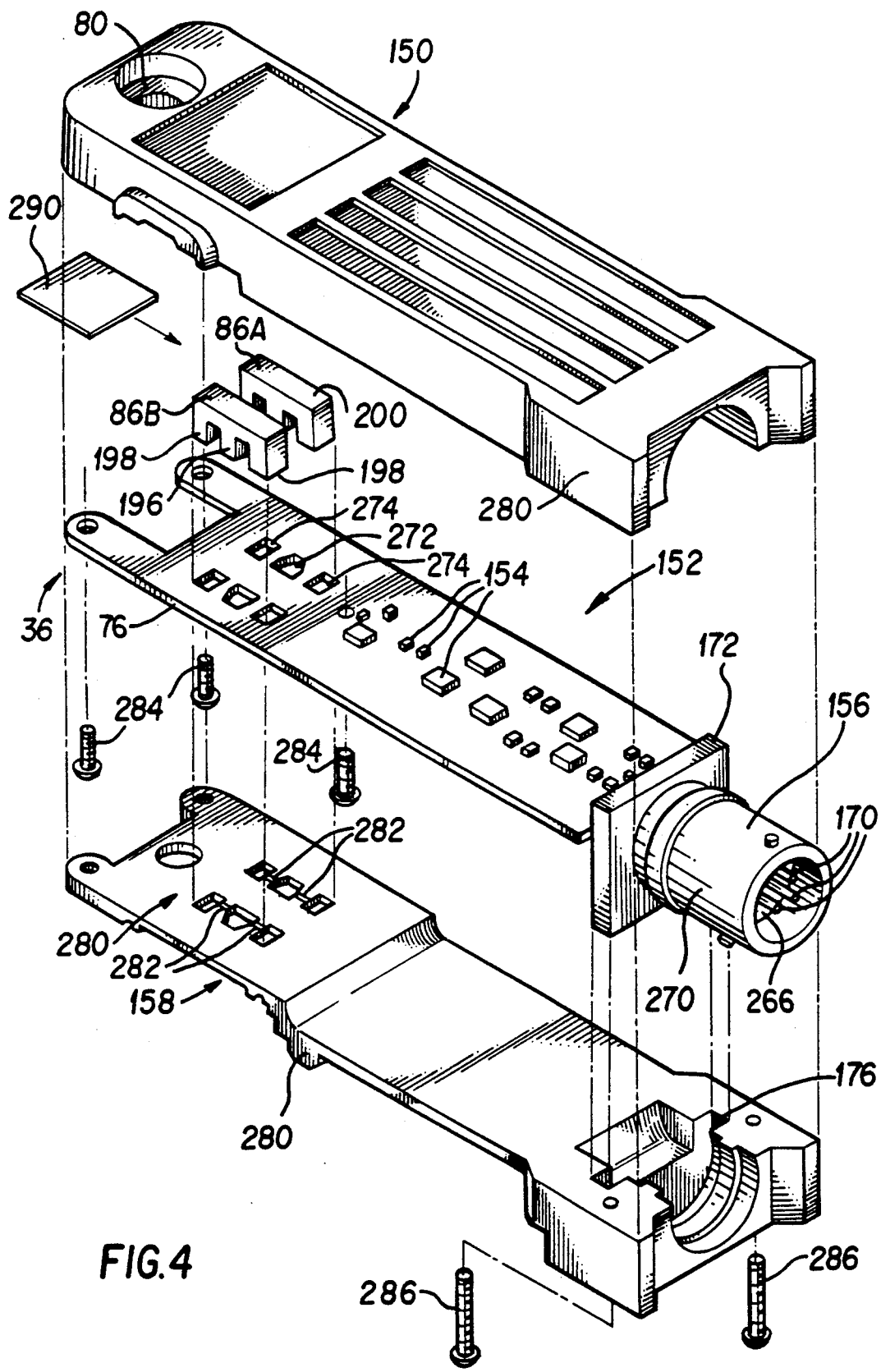
FIG. 4 is an exploded top isometric view of the upper member of the coupler assembly of FIG. 2.
Figure 5A:
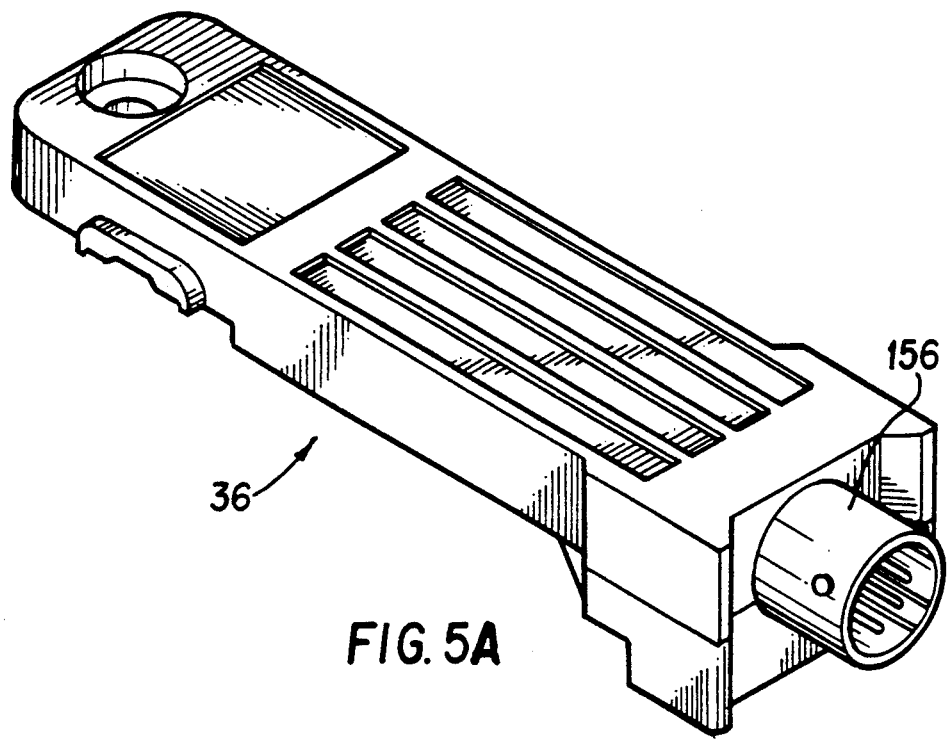
FIGS. 5A and 5B are top and bottom isometric views respectively of the upper member of FIG. 2.
Figure 5B:
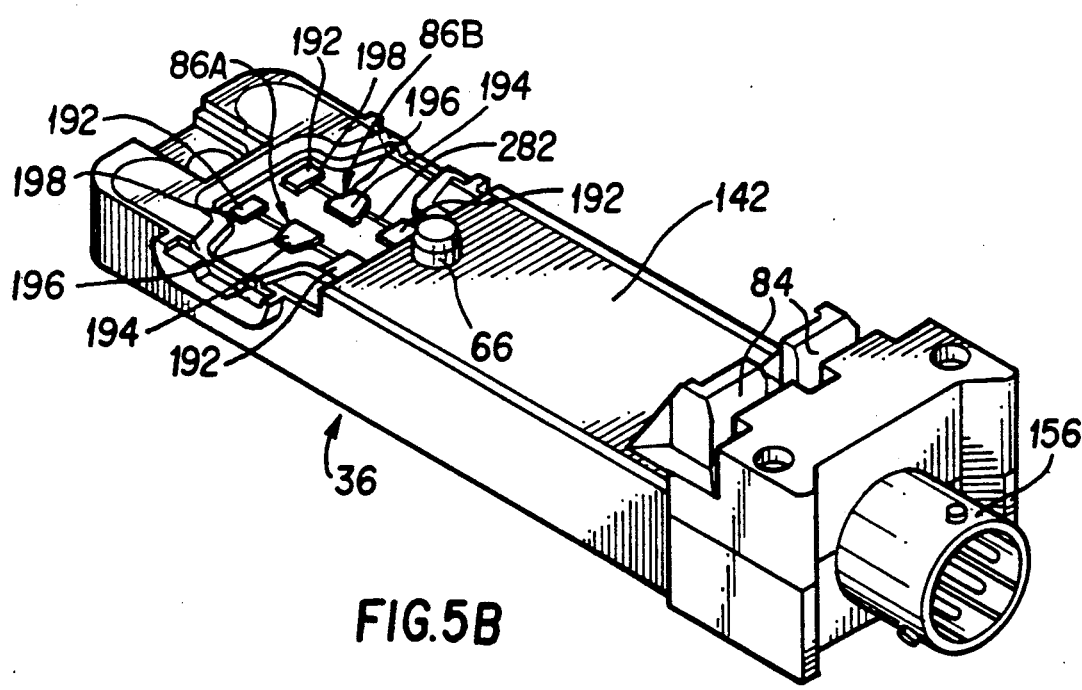
Figure 6A:
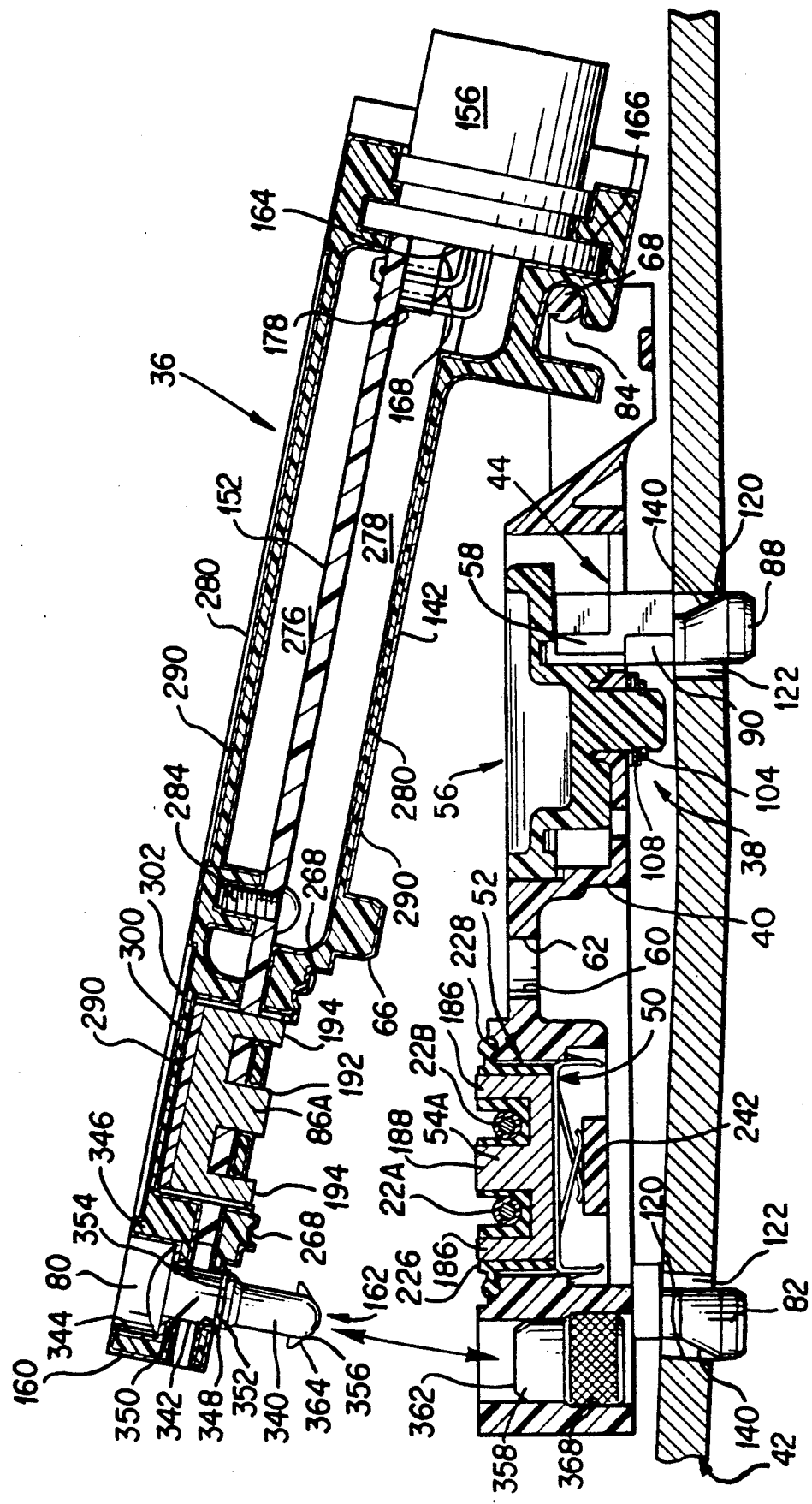
FIG. 6A is a longitudinal cross-sectional view taken along line 6-6 of the upper and lower members of the coupler of FIG. 2 being secured together to the conductor wires.
Figure 6B:
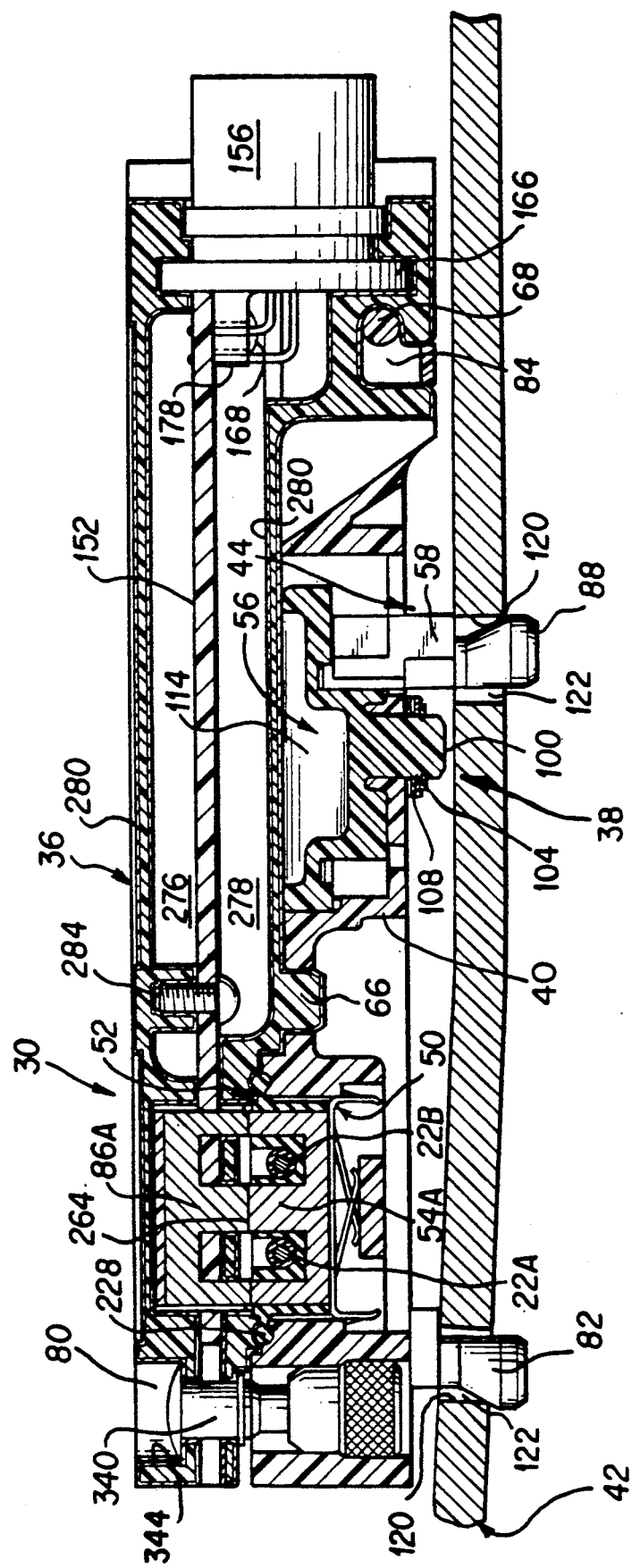
FIG. 6B is a longitudinal cross-sectional view taken along line 6—6 of the upper and lower members of FIG. 2 secured together to the conductor wires.
Figure 9A:
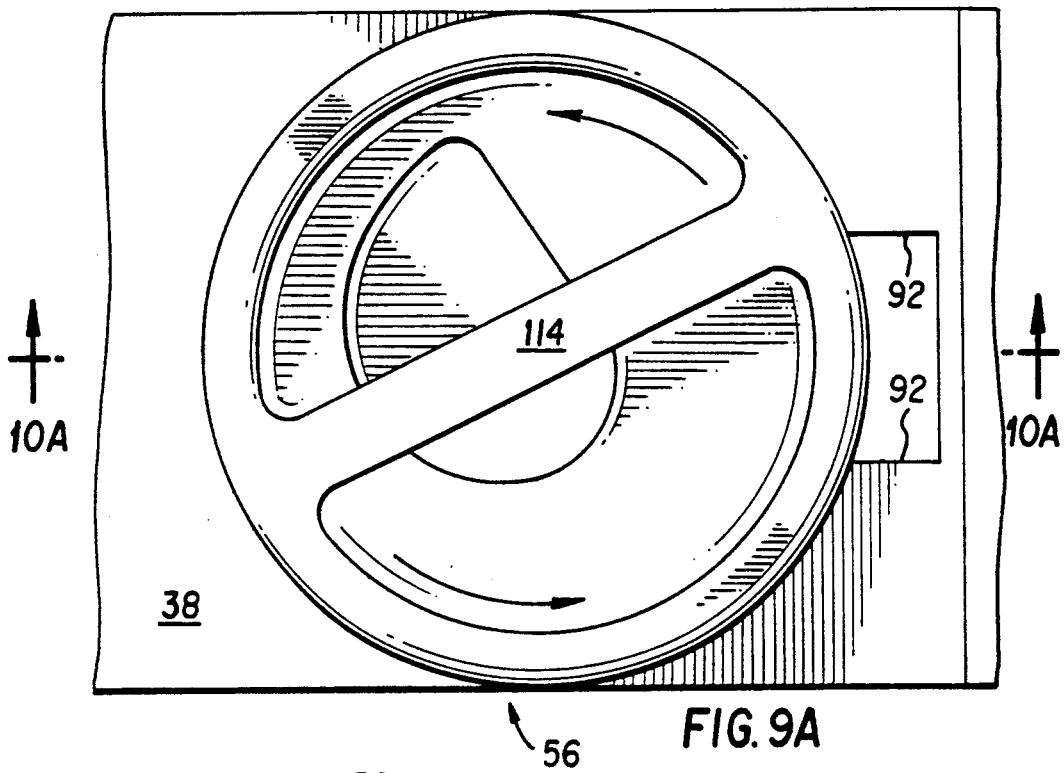
FIGS. 9A and 9B are top views of the cam member in the disengaged and engaged panel positions, respectively.
Figure 10A:
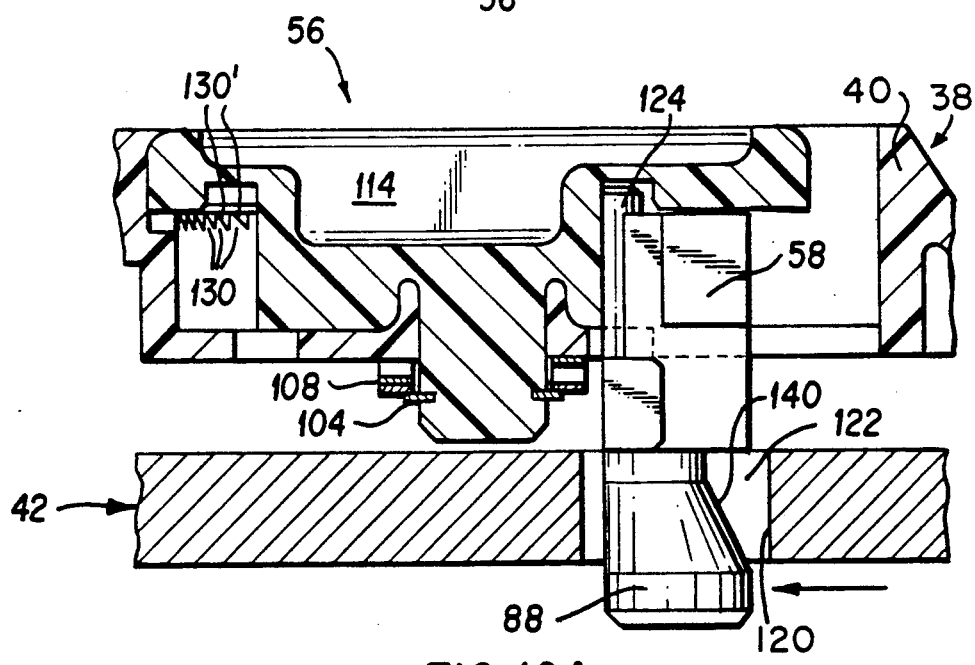
FIGS. 10A and 10B are longitudinal cross-sectional views taken along lines 10A—10A and 10B—10B, respectively of FIGS. 9A and 9B.
Figure 9B:
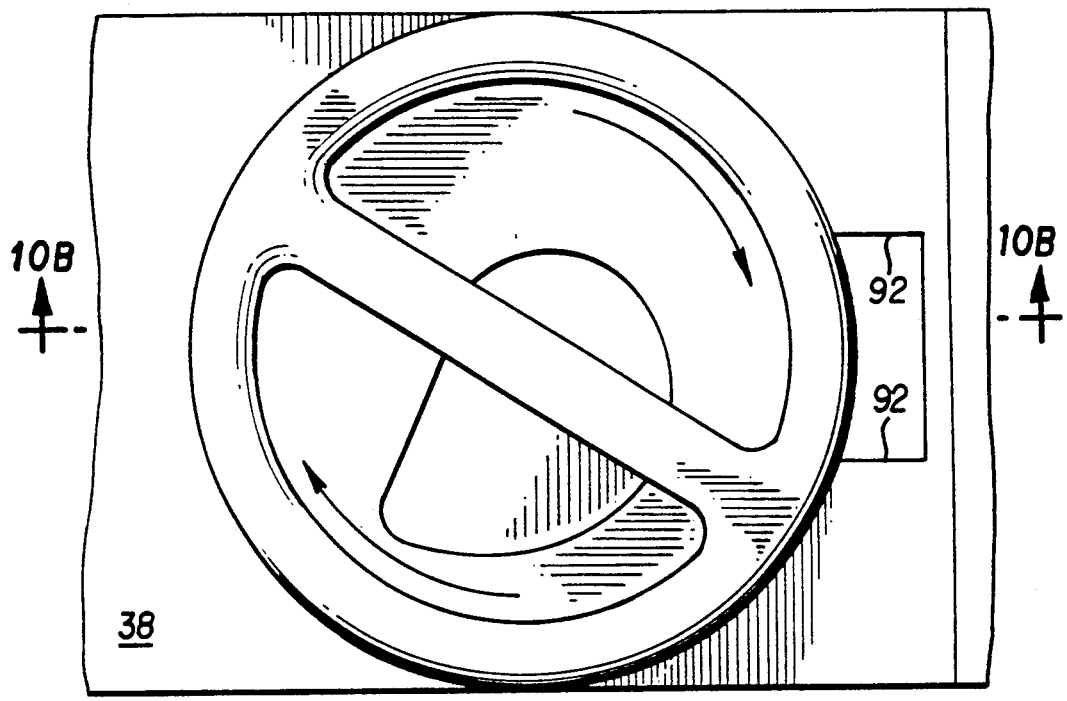
Figure 10B:
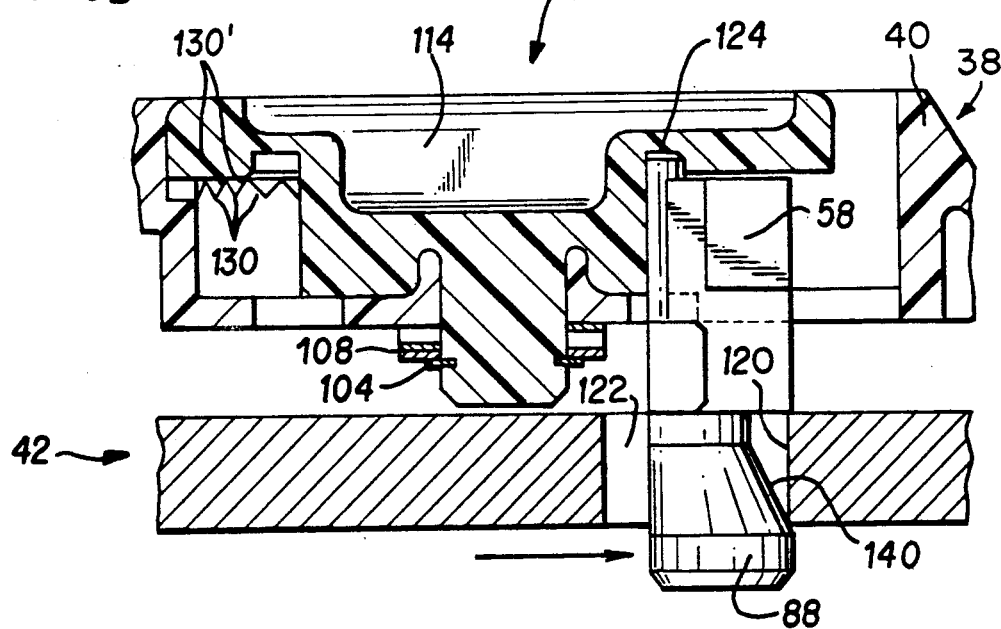

FIGS. 3A, 3B, 4, 5A and 5B show in greater detail the upper and lower members 36,38, and FIGS. 6A and 6B illustrate their assembly together FIGS. 3A and 3B illustrate components of lower member 38 of coupler assembly 30, including base 40, resilient spring means 50, an electromagnet insert or wire holding member 52 having electromagnets 54A, 54B, a cam 56, and a cam follower 58.

As shown in FIGS. 3A and 3B, lower member 38 includes a base 40 molded of dielectric plastic material, such as nylon, or a liquid crystal polymer ("LCP"). Base 40 includes an aligning recess 60 having aligning surfaces 62 to receive the upper member aligning means such as projection 66, pivot pins 68 positioned at one end 78, or "pivot end" of base 40, an electromagnet insert-receiving cavity 70, and a cam-receiving cavity 72 having a cam follower guide path. End 76 of base 40 opposite the pivot pins 68 or "coupling end", includes a fastener-receiving cavity 80 and fixed engaging members 82, such as "elephant" feet 82', extending in a downwardly direction.

As illustrated in FIGS. 6A and 6B, for precision alignment of the upper and lower members of the data coupler, base 40 of lower member 38 has a tapered aligning surface 62 formed on aligning recess 60, which engages projection 66 of upper member 36. Both projection 66 and aligning recess 60 are molded to precise corresponding shapes and dimensions, and in each of the upper and lower members all other features molded thereinto are measured from the location of the centerlines of the projection and recess which comprise respective reference datums for the molded parts. Projection 66, coupled with pivot pins 68 formed on base 40 of lower member 38 which fit within an elbow slot 84 of upper member 36, provides means to precisely align upper member 36 to lower member 38. This in turn precisely positions electromagnets 54A,54B of lower member 38 to electromagnets 86A,86B positioned in upper member 36.

As shown in FIGS. 3A, 3B, 7A, 7B, 8A, 8B and 8C, panel mounting means 44 comprise the "quick action" cam 56 which activates cam follower 58 having a movable engaging member 88, such as an "elephant" foot 88', to grasp panel 42. Cam follower 58 has side engaging surfaces 90 and shoulder engaging surfaces 94 which fit into and are guided by vertical and horizontal surfaces 92,96 of cam follower guide path 74 formed in lower member 38.

As shown in FIGS. 3B and 7B, the cam-56 has a cylindrical base 100 which fits into cam receiving cavity 72 formed within base 40 of lower member 38. Cam-receiving cavity 72 includes a lower opening 102, which receives cylindrical base 100 of cam 56. A "C"-shaped retention ring 104 secures cam 56 via a groove 106 formed on cylindrical base 100 to base 40. A spring washer 108 spaced between "C"-shaped retention ring 104 and lower surface 110 of base 40 allows cam 56 a degree of vertical movement along the major axis 112 of cylindrical base 100. A handle 114 is formed on top of cam 56 for turning cam 56 between engaged and disengaged positions. While a counter-clockwise cam movement for engagement of cam follower 58 to panel 42 is illustrated in FIG. 7B, a clockwise cam movement may also be used for initial engagement with the reverse movement providing the movement for disengagement.

As shown in FIGS. 9A, 9B, 10A and 10B, a plurality of predetermined engagement surfaces 120, such as side walls formed by openings 122, are formed on panel 42. The fixed engaging members 82, such as elephant feet 82', at first fit loosely within the associated 122 defining the engagement surface 120, and movable engaging member 88, such as elephant foot 88', at first fits loosely within opening 122 having engaging surface 120 and then is firmly engaged upon appropriate rotation of cam 38.

As shown in FIGS. 8A, 8B, 8C, and 10A and 10B cam follower 58 defining movable engaging member 88 has a projection 124 which fits within a cam slot 126, which defines a cam actuating surface 128 when rotated. The mating of projection 124 to cam slot 126 assures that cam follower 58 tracks the position of cam 56. As shown in FIGS. 5A, 5B, 6A and 6B, cam 56 via cam slot 126 and surface 128 engages the surface of projection 124 of cam follower 58 which forces engaging arm 88 in the proper engagement with engagement surface 120 of panel 42. Cam 56 applies the precise pressure setting to the engaging surfaces 120 via the movable engaging member 88 by movement of the cam handle 114 in a counter-clockwise direction to engage a plurality of engaging surfaces or base teeth 130, formed in cam-receiving cavity 72 of lower member 38. Cam 56 may be moved in a vertical direction along major axis 112 by compressing the spring washer 108, so that a plurality of corresponding engaging surfaces or cam teeth 132 formed on lower surface 134 of Cam 56 can engage and disengage base teeth 130 of lower member 38 as cam 56 is rotated. Each engaging member 82,88 includes a locking surface 140, which engages the engaging surface 120 of panel 42, defined by a tapered surface which biases lower member 38 against panel 42 as cam 56 actuates the movable engaging member 88 and fixed engaging member 82 into engagement with engagement surfaces 120 of panel 42.

As shown in FIG. 6B, when upper member 36 is secured over lower member 38, lower surface 142 of upper member 36 bears against cam handle 114 and locks cam handle 114 so that engaging members 82,88 are ruggedly secured in engagement with engagement surfaces 120 of panel 42. Thus, cam teeth 130 remain in engagement contact with base teeth 130. This prevents cam 56 from moving in a vertical direction, compressing spring washer 108 and disengaging cam teeth 132 of cam 56 from base teeth 130 of lower member 38. This provides a rugged panel-mounting means 44 to withstand vibrations, temperature and pressure changes, and cycling, yet provides quick action connection and disconnection from panel 42. It is also shown in FIGS. 6A and 6B that panel 42 may be gently arcuate as is common in aircraft, and that by reason of engaging surfaces 140 being tapered it is understandable that firm engagement is generated with corresponding panel engaging surfaces 122 of varying thicknesses within a limited range, and that the panel engaging surfaces may be opposing edges of a single cutout rather than discrete apertures.

Turning now to FIGS. 4, 5A, and 5B, upper member 36 comprises a top body member 150, a circuit substrate 152 having a plurality of surface mounted electrical components 154 connected to an electrical receptacle connector 156, the electromagnets 86A,86B, and a bottom body member 158.

As shown in FIGS. 6A and 6B, upper member 36 is fastened to lower member 38 about conductor wires 22A,22B at a coupling section 160 by fastener means 162 and at a connector section 164 by pivot pins 68 in lower member 38 held by and rotatable within an elbow slot 84 having arcuate bearing surfaces 166 in upper member 36. Connector section 164 includes an electrical receptacle connector 156, having a plurality of terminals 170 matable with a plug connector (not shown) terminating the end of a stub cable 32 of FIG. 1 connected to a control unit or black box 34.

A square shouldered flange 172 fits into a square flange receiving cavity 176 formed within the top and bottom body members 150,158 which allows fastening of a pair of spaced horizontal flanges 178 of electrical receptacle connector 156 to upper member 36 using screws 168, for example. In this manner, electrical receptacle connector 156 is secured to top and bottom body members 150,158 together upon their mating together to enclose the circuit substrate.

As shown in FIGS. 11A, 11B, 11C and 11D, the electromagnet insert 52 comprises an insert body 174, and the pair of electromagnetic magnets 54A,54B, each having a central leg 180 and outer legs 182 extending from transverse portion 184. One electromagnet 54A is used for receiving signals and the other electromagnet 54B is used for sending signals. As shown in FIG. 12, "E"-shaped electromagnets are preferably used. Electromagnets 54A,54B are preformed ferrite cores, which are embedded in insert body 174 formed of elastomeric material, such as silicon rubber, in a manner that secures the electromagnets 54A,54B. Electromagnets 54A,54B may be of the type sold by Ferroxcube Division of Amperex Electronic Corporation of Sangerties, N.Y., which are made from conventional material, such as linear ferrite, a ceramic filled with ferrous particles. Faces 186,188 are preferably smooth and precisely coplanar, with a variation in the height of legs 180,182 from 0.2 to 0.5 mils.

As shown in FIGS. 5B and 6B, the faces 186,188 of the central and outer legs 180,182 are exposed to engage with corresponding exposed faces 192,194 of central and outer legs 196,198 respectively, of corresponding E-shaped electromagnets 86A,86B formed on a transverse portion 200, which is secured within upper member 36 upon assembly. The exposed faces 186,188,192,194 may be covered with paper, plastic film or grease or other suitable covering to prevent oxidation of faces 186,188 of electromagnets 54A,54B prior to complete coupler assembly, and is removed at assembly.

Figure 11C:
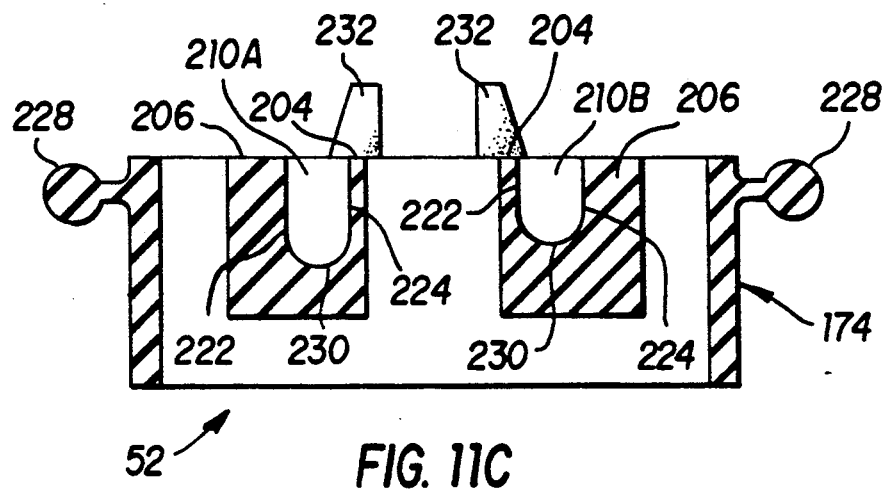
FIG. 11C is a cross-section view taken along line C—C of FIG. 11A.
Figure 11D:
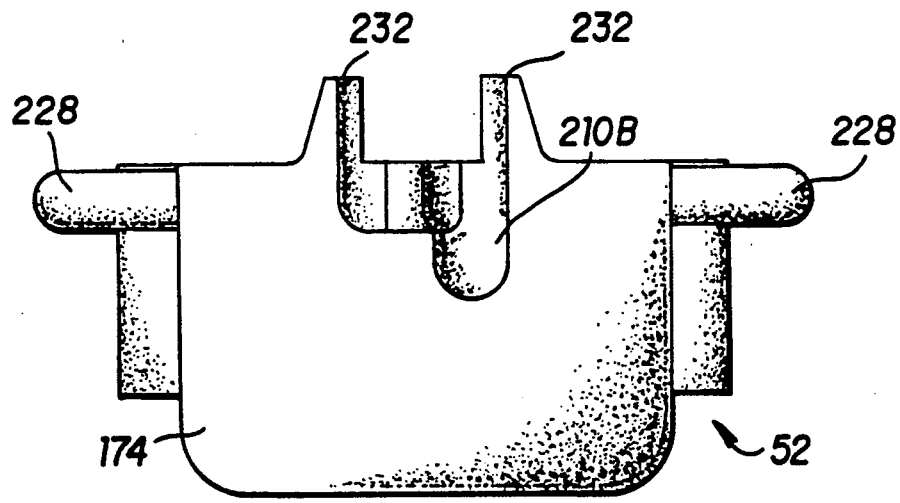
FIG. 11D is an end view of the electromagnetic insert of FIG. 11A.

As shown in FIGS. 11A, 11B, 11C and 11D, insert body 174 includes a pair of gently arcuate channels 210A,210B across upper surface 212 from first channel ends 214A,214B at first side 216 to second channel ends 218A,218B at second side 220 and between legs 180,182 of electromagnets 54A,54B. Arcuate channels 210A,210B generally take the configuration of loop 28 of twisted pair cable 22 and form a convex path away from each other which encloses central legs 180 of electromagnets 54A,54B. The slope of channel bottom 230 may be gradual as shown in FIG. 11B. Alternatively, arcuate channels 210A,210B may be shaped in a vertical profile where entire vertical rise of arcuate channels 210A,210B is defined to occur outwardly from the passage of arcuate channel 210A,210B past central legs 180 of electromagnets 54A,54B. In this manner, arcuate channels 210A,210B position loop 28 of twisted pair cable 22 in an essentially horizontal run past central legs 180 of electromagnets 54A,54B, which could provide for greater sensitivity to receiving or transmitting signals.

Preferably, electromagnets 54A,54B may be shaped to contour and shape of arcuate channels 210A,210B in order to provide maximum electromagnetic sensitivity. For example, as shown in FIG. 12, the center leg 180 may include a taper 208 to allow arcuate channels 210A,210B to position the twisted pair cable 22 in very close proximity to the central leg 180 of electromagnets 54A,54B. As shown in FIG. 11C, arcuate channels 210A,210B are constructed to have a relatively thin electromagnet insert wall 204 adjacent to the central leg 180 of the electromagnet or central leg wall 204, as compared to the electromagnet insert wall 206 adjacent outer leg 182 or outer leg wall 206. Typically, insert body 174 has a wall spacing of 0.025 inches between arcuate channels 210A,210B and central leg 180.

Conductor wires 22A,22B will be received and held along bottom 230 of arcuate channel 210A,210B because the distance between arcuate channel walls 222,224 is less than the diameter of conductor wires 22A,22B at least near the channel ends. This assures that conductor wires 22A,22B will be rigidly secured along arcuate channels 210A,210B between outer legs 182 and central leg 180 of each of electromagnets 54A,54B upon assembly.

As pointed out above, in order to assist in the proper positioning of conductor wires 22A,22B in arcuate channels 210A,210B, the particular three-dimensional shape of arcuate channels 210A,210B is enhanced by the taper 208 formed on center leg 180 of the E-shaped electromagnets 54A,54B. This holds conductor wires 22A,22B in the shape of loop 28 of the twisted pair cable, which reduces impedance and minimizes reflectivity of signal transmission along the wires.

As shown in FIG. 3A, electromagnet insert 52 is received into and secured within electromagnetic insert-receiving cavity 70, preferably under interference fit. As shown in FIGS. 11A, 11B, 11C, upper surface 212 of insert body 174 includes a sealing lip 228, such as an "O" shaped lip 228', formed about its periphery, and a pair of side seal extensions 232 to seal around first channel ends 214A,214B and second channel ends 218A,218B of arcuate channels 210A,210B. Side seal extensions 232 deform around conductor wires 22A,22B when upper member 36 is joined to lower member 38, such as shown in FIG. 6B.

As shown in FIG. 3A, upon assembly of insert-body 174 into electromagnet insert receiving cavity 70, first and second slots 234,236 define cable exits at the top of electromagnetic insert-receiving cavity 70 and receive extensions of the insert containing first channel ends 214A,214B and second channel ends 218A,218B respectively so that both conductor wires 22A,22B are received together through first slot 234, then into respective first channel ends 214A,214B, along the arcuate channels 210A,210B to second channel ends 218A,218B and together through second slot 236.

The electromagnetic insert-receiving cavity 70 includes a support ledge 242 to receive spring arms 244 for the resilient spring means 50, a plurality of holes 246 therethrough for the venting of air upon insertion of electromagnet insert-52 into electromagnet insert receiving cavity 70 under interference fit, and a vertical support rib 248. Vertical support rib 248 is located between electromagnets 54A and 54B and includes posts extending upwardly between opposing outer legs 182 and opposing central legs 180 of the electromagnets, with rib 248 and its posts extending into corresponding recesses into the bottom surface of the elastomeric material forming insert body 174 of electromagnet insert 52, as seen in FIG. 3B, and thus tend to rigidify insert body 174 between the pairs of legs of the lower member electromagnets 54A,54B for stabilizing each electromagnet against strain applied by twisted pair cable 22. Electromagnet insert 52 has at least one resilient spring means 50, and preferably a pair of resilient spring means 50 to permit insert body 174 to sustain further compression when urged downwardly by the assembly of upper member 36 to lower member 38.

Referring to FIGS. 6A, 6B and 13A-13D, resilient spring means 50 is provided to keep lower member electromagnets 54A,54B closely adjacent to, and in contact with, upper member electromagnets 86A,86B to minimize the air gap, which enhances transfer of energy. The resilient spring means 50 comprises a unitary member having a pair of spring arms 244 formed in a juxtaposed "X" configuration from a portion of a support surface 250, which engage support ledge 242 of electromagnet insert-receiving cavity 70. Spring arms 244 extend from each end of support surface or biasing 250 downwardly to form the juxtaposed "X" configuration, and are tapered towards the ends 252 of spring arms 244 engaging support ledge 242. Ends 252 of spring arms 244 are slightly bent upwardly to form a smooth bearing surface 260 to engage support ledge 242. A suitable material to construct the resilient spring means is stainless steel, or other materials including plastics having suitable spring characteristics.

Two sides 254 of resilient spring means 50 extend from each end 256 of support surface 250 and have outwardly extending locking tabs 258. These locking tabs 258 engage downwardly facing ledges along side walls 262 (FIGS. 6A and 6B) of electromagnet insert-receiving cavity 70 to secure resilient spring means 50 within electromagnet insert-receiving cavity 70.

Figure 13B:
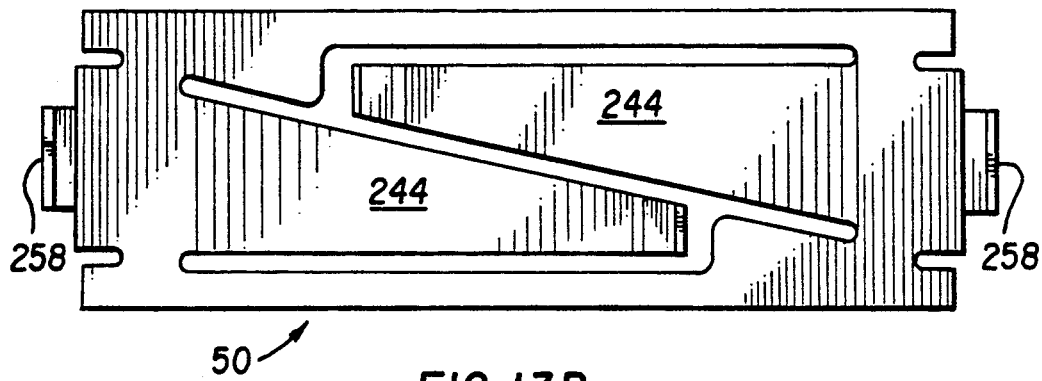
FIG. 13B is a top plan view of the resilient spring means of FIG. 13A.
Figure 13D:
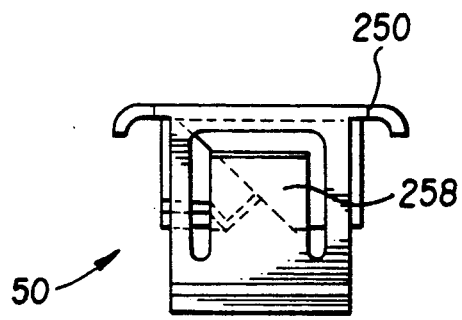
FIG. 13D is an end view of the resilient spring means of FIG. 11A.
Figure 13C:
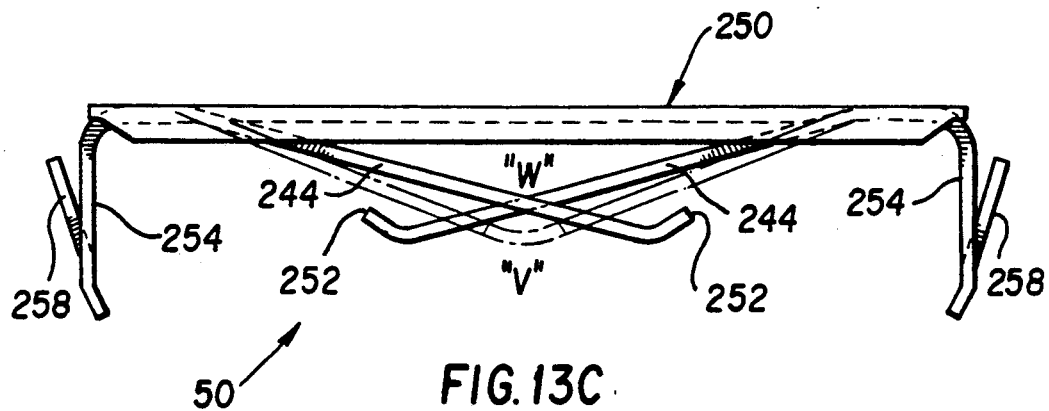
FIG. 13C is a side view of the resilient spring means of FIG. 13A.

As shown in FIGS. 13A and 13B, tapered spring arms 244 of resilient spring means 50 provide a maximum degree of structural material at the point of spring action which assures reliable spring action during intense vibrations, temperature and pressure cycling and other stresses. This assures continued engagement between upper and lower member electromagnets 54A,54B,86,86B to form an electromagnet core 264, as shown in FIG. 6B, which has essentially no air gap. After electromagnet insert-52 is secured within electromagnet insert receiving cavity 70, the end faces 186,188 of the electromagnet central and outer legs 180,182 may be covered with a protective paper, grease or the like which will be removed just prior to placement of conductor wires 22A,22B into arcuate channels 210A,210B.

As illustrated in FIG. 6A, upper surface 226 of electromagnet insert 52 is preferably raised slightly above the top of electromagnet insert-receiving cavity 70 prior to complete assembly of coupler assembly 30 via upper member 36; lower member 38 is shown mounted to panel 42 by panel-mounting means 44, and conductor wires 22A,22B are in place in arcuate channels 210A,210B of electromagnet insert 52.

Referring now to FIG. 4, upper member 36 comprises top body member 150, bottom body member 158, circuit substrate 152, electrical components 154 preferably surface mounted on the upper and lower surfaces of circuit substrate 152, electrical receptacle connector 156 which interconnects circuit substrate 152 to stub cables 32 and control units 34, and the pair of "E"-shaped electromagnets 86A,86B. A suitable material for forming the top and bottom body members is a liquid crystal polymer ("LCP"), which can be plated with metallic materials, and may be VECTRA C-810 or alternatively may be VECTRA A-130 (trademark of Celanese Corporation). Electromagnets 86A,86B are constructed of preformed ferrite cores, similar to lower member electromagnets 54A,54B.

Electrical receptacle connector 156 includes a dielectric housing 266 containing the plurality of terminals 170, and a metal shell 270 secured around housing 266. Square flange 172 fits within square receiving cavity 176, which by its square shape enables electrical receptacle connector 156 to be secured to upper member 36, when top and bottom body members 150,158 are joined together around the circuit substrate to form upper member 36. Generally, electrical receptacle connector 156 may be a conventional type, such as one meeting Military Specification 26500, or other suitable electrical receptacle connector.

Electromagnets 86A,86B each include central leg 196, having the same taper 208 of central leg 180 of electromagnets 54A,54B, and two outer legs 198 extending from the transverse portion 200. Coupling end 76 of circuit substrate 152 includes central and outer leg-receiving apertures 272,274 to receive central leg 196 and outer legs 198, respectively of electromagnets 86A,86B therethrough. Screws 284 secure circuit substrate 152 to top body member 150, with electromagnets 86A,86B secured therebetween.

As shown in FIGS. 4, 6A and 6B, electromagnetic shielding to provide electromagnetic interference ("EMI") or radio frequency interference ("RFI") protection of the electrical components 154 is accomplished by plating the top and bottom body members 150,158 of upper member 36. Plating 280 on top and bottom upper body members 150,158, along with either conductive adhesive or electromagnetic taping of all seams between the plating 280 of the top and bottom upper body members 150,158, provides a continuous three-dimensional shield surrounding the electronic package for EMI/RFI protection.

As shown in FIG. 6A, top body member 150 includes a cavity 276 formed above circuit substrate 152 and having enough depth to receive thereinto circuit substrate 152 and the coextending planar and slightly narrower portion of bottom body member 158 so that the top and bottom body members are spaced from and fit around the electrical components 154 mounted on the top 152 and the bottom (not shown) of the circuit substrate 152, and the seam between the top and bottom body members necessarily includes a right angle (see FIG. 5B). Bottom body member 158 includes a seal-engagement surface 268 formed on the lower surface such that upper member 36 receives sealing lip 228 of electromagnet insert 52.

Plating 280 to shield EMI/RFI is positioned on all exposed surfaces of top and bottom body members 150,158, and members 150,158 are molded with generous radii at all corners to facilitate adherence of the plating material thereto. Also, it is preferred that the exposed surfaces define a microscopically irregular surface to enhance plating material adherence which may be accomplish with molds which have been sandblasted to a textured surface. Slots 282 joining the leg-receiving apertures of bottom body member 158 define plating gaps 282, which disallow conductive engagement of the plating 280 around electromagnets 86A,86B. The plating gaps 282 prevent a conductive path from being formed by a continuous winding around tee legs 196,198 of electromagnets 86A,86B, which minimizes any unwanted coils and inductance generation by the plating 280 and interference with transmit or receive signals. Typically, plating 280 comprises an electrolessly plated coating of copper followed by thin coating of nickel electroplated thereonto, which forms a layer of plating from 0.250 mils to 0.600 mils in thickness; the ratio of the copper thickness to that of the nickel may be about 5:1.

For best EMI/RFI protection, all seams between the top and bottom body members 150,158 are filled with conductive adhesive when the top and bottom body members 150,158 are joined together by the adhesive material peripherally therearound and by screws 286 at the pivot end 78 to form an integral upper member 36.

Figure 14A:
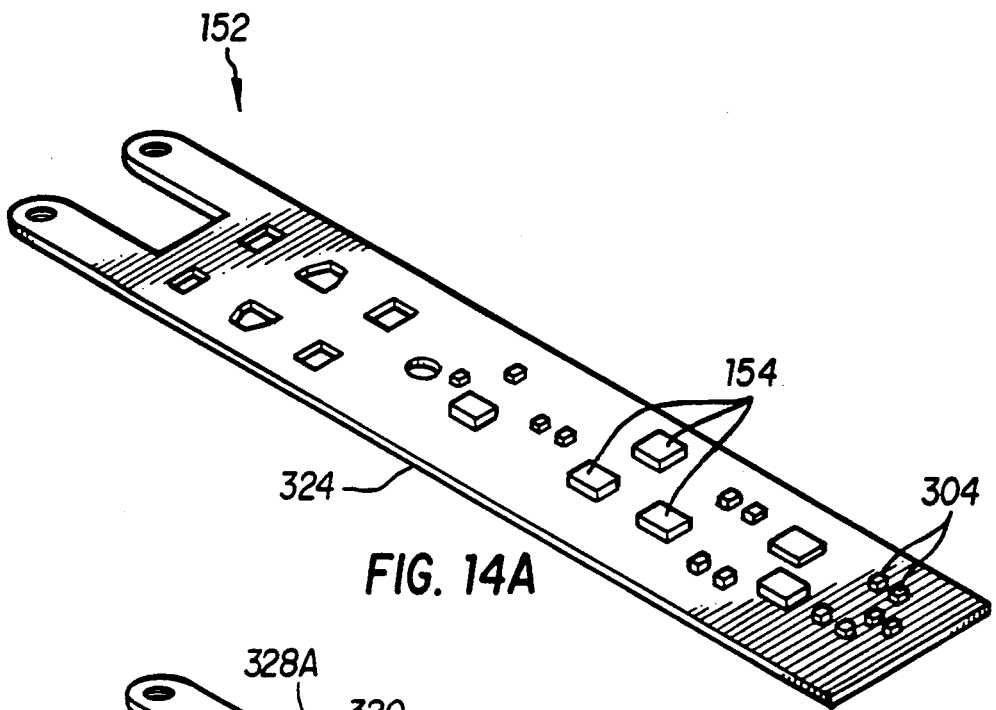
FIG. 14A is a top isometric view of a circuit substrate of the upper member of the coupler having surface mounted electrical components on the upper surface of the circuit substrate, which is also illustrative of a bottom isometric view of the circuit substrate having electrical components surface mounted on the bottom of the circuit substrate.

As illustrated in FIG. 14A, circuit substrate 152 includes circuit-bearing members 304 to which are secured by surface-mounting a plurality of electrical components 154 such as capacitors, resistors, transistors, diodes, and so on, defining amplifier circuits appropriate for signal amplification.

Power is provided to coupler assembly 30 by control unit 34 through electrical receptacle connector 156 of upper member 36, and chassis grounding is also provided thereby. Signals received from data bus are amplified for transmission to the control unit 34. Signals are also received from control unit 34 and are amplified to be sent along the data bus system 20.

Transmitted signals are preferably of the doublet type, encoded as such within control unit 34 of FIG. 1 such as by means of a Serial Interface Module. The electronic components may also have appropriate circuits to provide coupler assembly 30 with redundant receiving and transmitting capability.

Figure 14B:
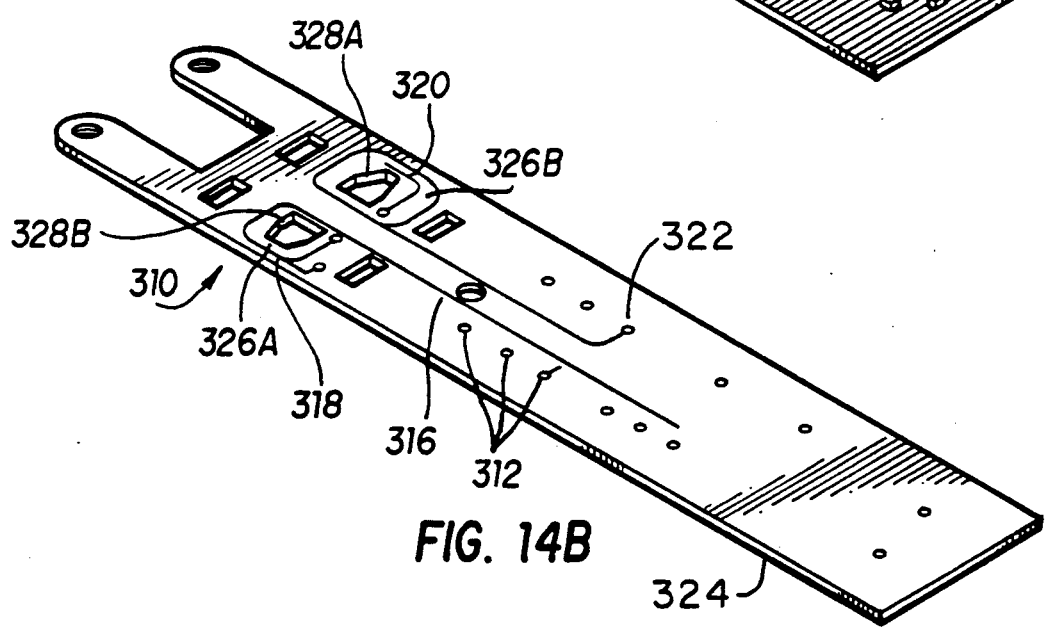
FIG. 14B is an isometric upper view of one of the internal layers of the circuit substrate of FIG. 4, showing two of a plurality of traces having inductance coils for the electromagnets.

FIG. 14 shows one of a plurality of layers 310 which may comprise circuit substrate 152. Typical layer 310 includes a plurality of conductive pads 312 which engage electrical circuity 316, such as trace circuit paths 318 comprising the inductance coil windings 320. For example, heat-resistant thermoplastic film or glass fibers embedded in epoxy to isolate the circuitry on their facing surfaces may be used. Trace circuit paths of layers 310 are disposed on respective upper surface 322 and lower surfaces 324 which will be interior surfaces of layers 310, and together upon assembly will define inductance coils 326A,326B about central apertures 328A,328B respectively. The number of layers 310 is dependent on the particular characteristics of the electrical signals to be transmitted and received For example, six layers of trace windings will provide for sufficient inductance coils 326A,326B for most applications. Further, details of other suitable circuit substrates 152, and the construction of trace circuit paths 318, are described in U.S. Pat. No. 4,904,879, cited above.

As shown in FIG. 4, electromagnets 86A,86B are inserted into circuit substrate 152, with an optional resilient member 290 positioned above electromagnets 86A,86B. Top body member 150 receives transverse portion 200 of electromagnets 86A,86B. After the insertion of electromagnets 86A,86B, the resilient member 290, if used, is placed within a recess 300 above the transverse portion 200 of electromagnets 86A,86B securing them within top body member 150. This fills any incremental spaces between transverse portions 200 of electromagnets 86A,86B and the top wall 302 of the recess 300.

The end faces 192,194 of central leg 196 and outer legs 198, respectively, preferably extend incrementally outwardly below the bottom surface of circuit substrate 152. After assembly of electromagnets 86A,86B into upper member 36 a protective cover, such as a piece of paper, plastic film or grease, for example, may be removably secured over end faces 192,194 until final coupling of upper and lower members 36,38, at which time protective cover is removed.

FIGS. 6A and 6B illustrate how upper and lower members 36,38 are finally secured together about conductor wires 22A,22B. A screw 340 of a fastener means 342 has been inserted into a profiled aperture 344 through an end flange 346. A hole portion 348 is dimensioned to be slightly larger than a shaft portion 350 to allow rotation. A "C"-shaped retention ring 352 secures within a groove 354 to hold screw 340 in aperture 344. If needed, protective covers or like are removed from the faces 186,188,192,194 of electromagnets 86A,86B. Pivot pins 68 are placed in position into elbow slots 84, and upper member 36 is then pivoted so that electromagnets 86A,86B are moved toward electromagnets 54A,54B of lower member 38.

A locking end 356 of screw 340 enters a socket section 358 of a socket 362. During pivoting, the upper member aligning means 64, such as projection 66 on upper member 36 enters the aligning recess 60 and engages aligning surfaces 62 of lower member 38. Preferably, the lowermost portions of projection 66 are tapered or chamfered to comprise lead-ins facilitating alignment of upper member 36 with lower member 38. The arcuate bearing surfaces 166 of elbow slots 84 of upper member 36 coupled with the upper member aligning means 64 of the upper member 36 assure proper engagement with lower member 38 prior to being secured together.

Referring to FIGS. 6A and 6B, fastener means 342 can be one-quarter-turn fasteners of the type sold by Southco, Inc. of Lester, Pennsylvania under Part Nos. 82-11-240-16, 82-32-101-20, and 82-99-205-15. It is preferred that the fastener be spring biased after turning to maintain the coupling end of the upper and lower coupler members firmly together to maintain assured mechanical engagement of the mating faces of the electromagnets, and this may easily be accomplished by a curved washer under the head of the fastener 340 with a flat washer between the curved washer and the plated plastic to protect the upper coupler member against wear, all as is conventional.

Screw 340 is adapted to be rotated by a screwdriver to lockingly engage the socket 362. The locking end 356 includes a pair of wing tabs 364 received along channels (not shown) formed at the top of socket section 358, whereafter upon appropriate rotation of screw 340 by a tool, wing tabs 364 override and latch behind stop surfaces defined by inward bosses (not shown) formed in the top portion of socket section 358. Socket 362 includes a knurled enlarged head 368, which is held firmly within profiled aperture 344 after being force fit thereinto. Fastener means 342 permits disassembly if desired, and other suitable fastening mechanisms can optionally be used. Electromagnet insert 52, which is slightly raised above the top surface of lower member 38, is urged further into electromagnet insert-receiving cavity 70 of the lower member 38 and biased against resilient spring means 50 when upper member 36 is locked into place by screw 340 being rotated through a 90 degree turn, thereby rotating the wing tabs 364 into locking position behind and beneath corresponding bosses (not shown) of socket 362. The resilient spring means 50 via spring arms 244 becomes slightly compressed against the support ledge 242 and applies continuous slight bias of electromagnet faces 186,192 and 188,194 against each other after assembly.

Figure 15:
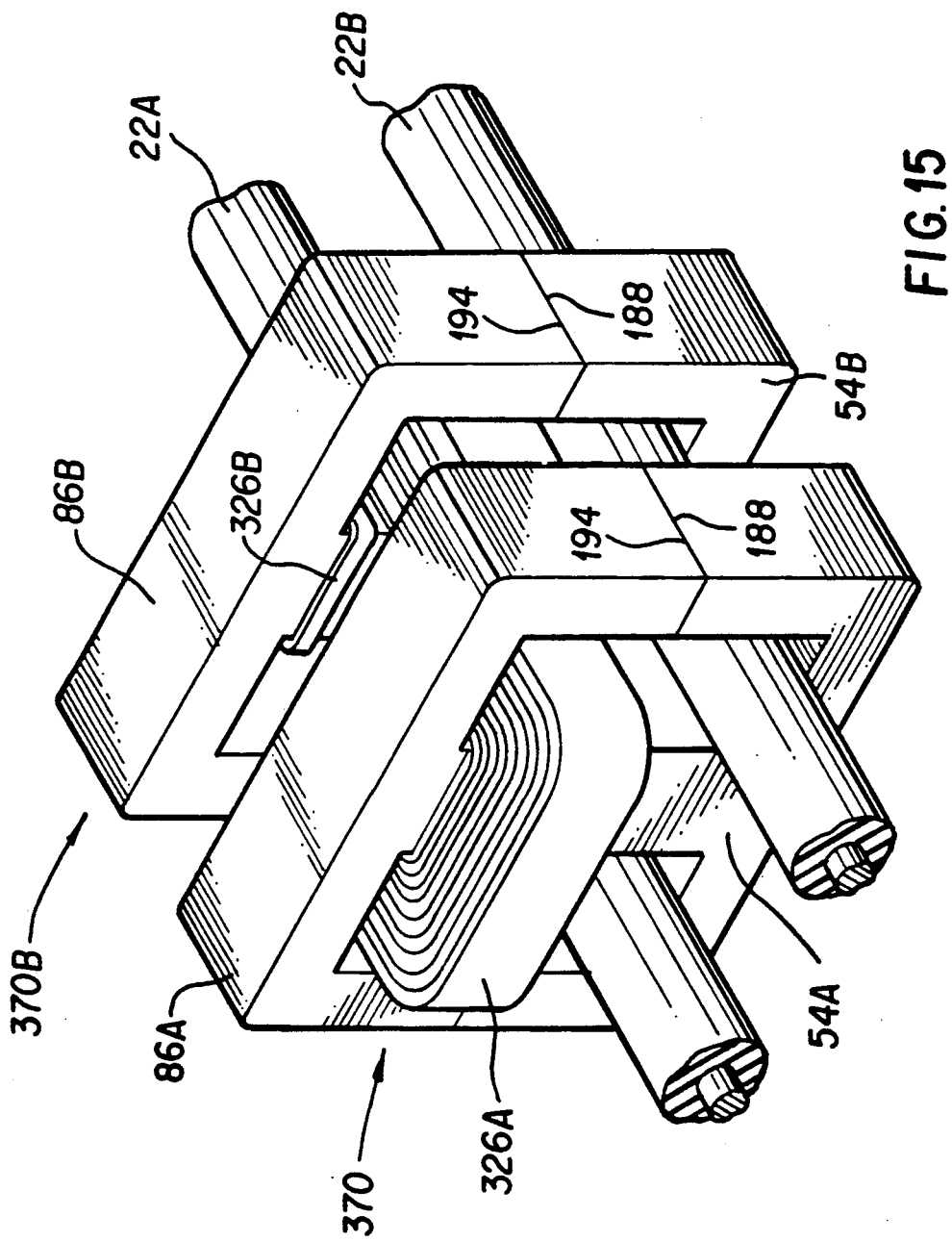
FIG. 15 is an illustration of the electromagnets and windings therearound, coupled to the conductor wires.

As illustrated in FIG. 15, electromagnet faces 192,194 engage corresponding electromagnet faces 186,188 to complete the formation of two electromagnet cores 370A,370B about conductor wires 22A,22B. A first core 370A comprising electromagnets 54A,86A is a receiving core, and a second core 370B comprising electromagnets 54B,86B is a transmitting core.

There are modifications and variations which may be made to the preferred embodiment described herein. For example, various types of electromagnets may be used to form the electromagnet cores suitable for use with the coupler assembly 30. For example, other electromagnets suitable for use with the data coupler 30 include those forming a "C"-core, "H"-core, and pot cores. Further, a single coupler assembly 30 may include only the single receiving core 370A, or the single transmitting core 370B.

Figure 16B:
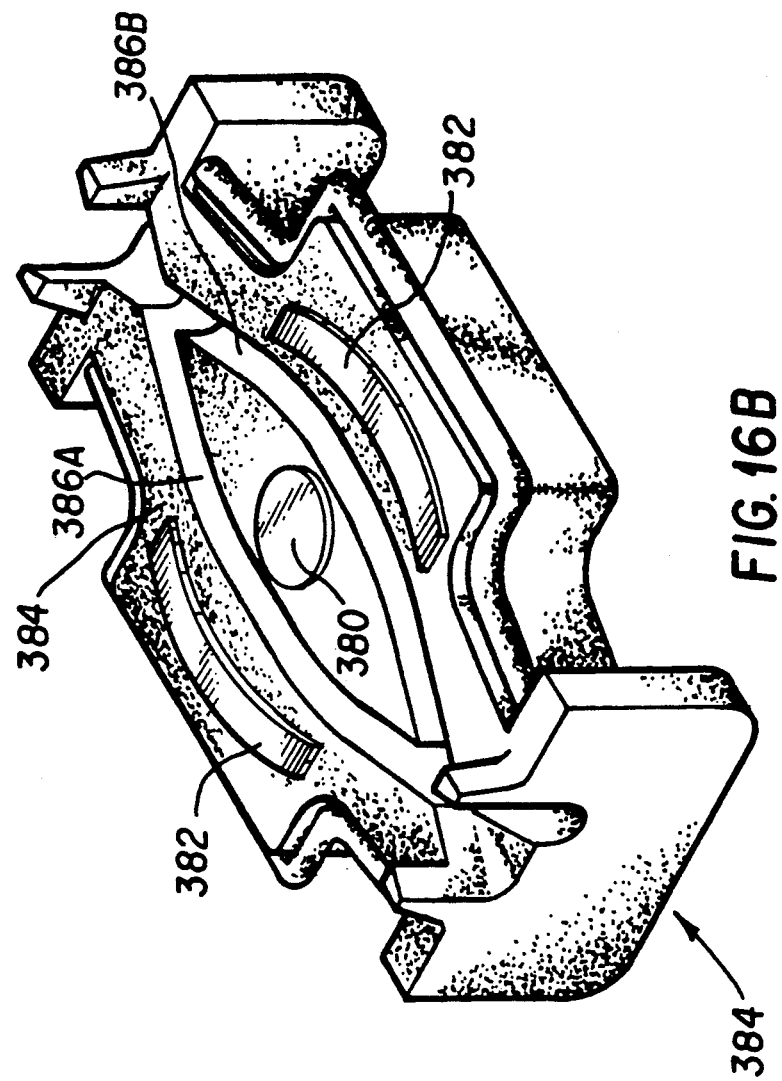
FIG. 16B is an isometric view of an alternative embodiment of an electromagnet insert used for either sending or receiving signals.
Figure 16A:
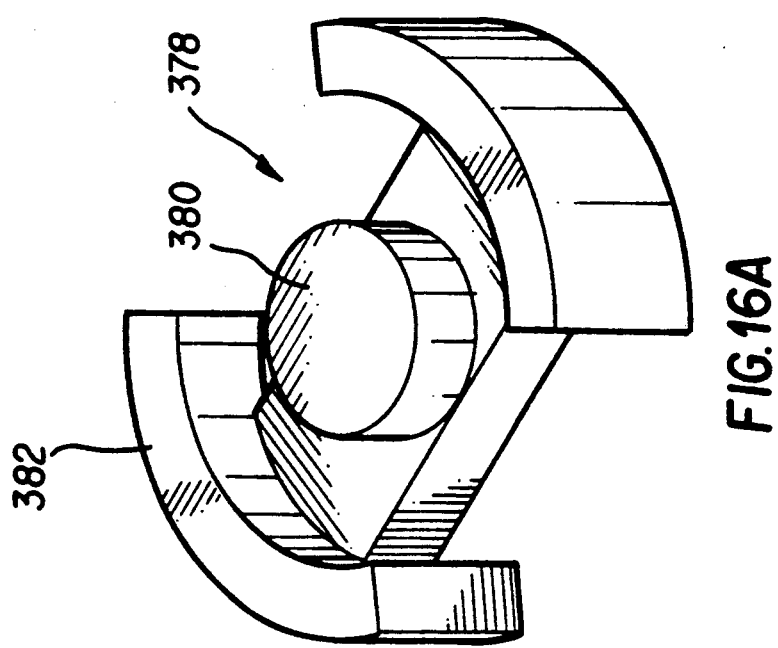
FIG. 16A is an isometric view of an alternative embodiment of the present invention showing a single electromagnet used for either sending or receiving signals.

As shown in FIG. 16A, an electromagnet 378 forming a single pot core would provide an ideal shape to receive a single loop 28 of a twisted pair cable 22 for either transmitting or receiving signals. As shown in FIG. 16A and 16B, electromagnet 378 for a single pot core includes a central leg 380 and two outer legs 382, which fit within an insert body 384 having a pair of arcuate channels 386A,386B. Further, central leg 380 may be shaped in an elliptical cross section to better fit within a loop 28 of twisted pair cable 22 and minimize the formation of unwanted impedance. Alternately, a pair of electromagnets 378, positioned into a single coupler assembly 30, can be arranged side-by-side on adjacent or non-adjacent loops 28 for receiving and transmitting signals from twisted pair cable 22.

In yet in another variation, the electromagnet insert 52 may be divided into two parts one for the receiving electromagnet 54A and one the transmitting electromagnet 54B. While this embodiment of electromagnet insert 52 (shown by line Z—Z in FIG. 11A) may be used for both receiving and transmitting cores 370A,370B, it is also apparent that one part of the divided electromagnet insert 52 holding an "E" shaped electromagnet 54A may also be used to hold a single receiving or transmitting electromagnet 54A,54B.

In another variation, spring arms 244 may, in addition to forming the juxtaposed "X" configuration, comprise either a juxtaposed "W" or "V" configuration. The selection of a particular configuration, either "W", "V" or "X" which have decreasing spring rigidity, respectively, would depend on the degree of needed spring action and required stiffness.

As shown in FIG. 17, resilient spring means 50 may comprise a plurality of coil springs 392 disposed between a support member 394 under electromagnet insert 52. Support member 394 has a plurality of projections 396 which lock the coil springs 392 into position on each side of support member 394.

In another variation, dielectric potting compound, such as epoxy resin, may be injected within upper and lower cavities 276,278 to embed and seal the electronic components 154. The potting material is desirable to be resistant to thermal shock and to have a low coefficient of thermal expansion to minimize stressing on electrical components 154 upon elevated temperatures, and also be compatible with the coefficients of circuit substrate 152. One such potting material is 4215 epoxy resin sold by Dexter Hysol Company of Olean, N.Y.

In yet another variation, guide surfaces 92 of lower member 38 may direct the movable engaging member 88 in other than directions away from fixed engaging member 82. This is accomplished by positioning cam 56 to move cam follower 58 along the redirected guide surfaces 92, such as one which directs the movable engaging member 88 toward fixed engaging member 82.

Upper and lower members 36,38, respectively, may preferably be placed in containers such as plastic blister packages for their protection prior to installation.

The embodiments above provide a number of significant advantages. The coupler assembly 30 includes a quick action panel-mounting means 44 which quickly and accurately positions coupler assembly 30 onto a panel 42. In a like manner, the coupler may be quickly removed from panel 42 for replacement.

In another advantage, electromagnets 54A,54B,-86A,86B conform to the shape of loop 28 of twisted pair cable 22 via arcuate wire channels 210A,210B formed within electromagnet insert 52 along with the shape of the center legs of the electromagnets. This reduces impedance and minimizes reflectivity of signal receptions and transmissions along conductive wires 22A,22B. The shape of arcuate channels 210A,210B position conductor wires 22A,22B closer to center leg 180 of electromagnets 54A,54B than outer legs 182, which also improves signal transmission and reception.

As yet another advantage, a rugged resilient spring means 50 is positioned in electromagnet insert-receiving cavity 70 to assure biased engagement of the upper and lower electromagnets 54A,54B,86A,86B. This minimizes any air gap between the interfaces of electromagnet cores 370A,370B and provides a rugged construction to maintain core engagement during temperature cycles, vibrations, and pressure cycles. Sealing lip 228 of electromagnet insert 52 together with side seal extensions 232 assure an intact engagement to control moisture between the pairs of electromagnets 54A,54B,-86A,86B together to form electromagnetic inducting cores 370A,370B.

As yet another advantage, EMI/RFI protection is provided by the plating 280 formed by direct metallic coating onto the top and bottom upper body members 150,158. This plating, preferably of nickel and copper materials, reduces the weight and complexity of the coupler assembly 30, yet provides adequate EMI/RFI protection Of course, it should be understood that a wide range of changes and modifications can be made to the preferred embodiment described above. It is therefore intended that the foregoing detailed description be regarded as illustrative rather than limiting, and that it be understood that it is the following claims, including all equivalents, which are intended to define the scope of this invention.

We claim:

1. A data coupler member for inducting power in at least one electromagnet assembled thereto to form an electromagnet core when mated with a corresponding coupler member containing a corresponding electromagnet, said member comprising an assembly of a circuit substrate, a top body member and a bottom body member, and said electromagnet secured therewithin and having leg portions extending through leg-receiving apertures of said circuit substrate and said bottom body member to mating faces exposed for coupling with corresponding mating faces of said corresponding electromagnet, said top and bottom body members define a cavity along an interface therebetween;

said circuit substrate including electrical components mounted on at least one surface thereof, said electrical components having circuits inductively coupled to said at least one electromagnet; and said top and bottom body members having EMI/RFI shielding formed by plating at least one surfaces around said cavity, and engaging portions of said top and bottom body members being conductively joined at said interface surrounding said cavity after said circuit substrate has been disposed therewithin, said plating surrounding said circuit substrate thereby protecting said electrical components from EMI/RFI interference, with said leg portions extending through said leg-receiving apertures of said bottom body member and thus through said plated surfaces for mating with said corresponding electromagnet.

2. The data coupler member as set forth in claim 1 wherein said plating comprises a first layer of copper followed by a second layer of nickel.

3. The data coupler member as set forth in claim 1 wherein said plating comprises a thickness from about 0.250 to about 0.500 mils.

4. The data coupler member as set forth in claim 1 wherein said top and bottom body members are joined together surrounding said cavity by conductive adhesive, complementing the shielding defined by said plating.

5. The data coupler member as set forth in claim 1 wherein all exposed surfaces of said bottom body member are plated, and said plating on surfaces defining the periphery of each leg-receiving aperture is at least incrementally interrupted in a manner preventing a conductive path being defined by the plating material to completely surround a respective electromagnet leg extending through said leg-receiving aperture.

6. The data coupler member as set forth in claim 5 wherein said interruptions are defined by slots through said bottom body member in communication with adjacent ones of said leg-receiving apertures.

7. The data coupler member as set forth in claim 1 wherein either said top member or said bottom body member or both comprises liquid crystal polymer.

8. The data coupler member as set forth in claim 5 wherein said electrical components define amplifier circuits for amplifying at least one of received signals and transmitted signals.

9. The data coupler member as set forth in claim 5 wherein corners of said top and bottom body members are rounded, and said exposed surfaces are microscopically irregular prior to plating, all to facilitate adherence of said plating material.

10. The data coupler member as set forth in claim 1 wherein said bottom body member coextending along said circuit substrate has a width just narrower than the width of said cavity of said top body member and is received into said cavity upon assembly, whereby plated portions of said top body member around said cavity coextend along plated side surfaces of said bottom body member, maximizing the shielding effect of said plating.

* * * * *